US012684889B2

(12) United States Patent
Jang et al.

(10) Patent No.: US 12,684,889 B2
(45) Date of Patent: Jul. 14, 2026

(54) IMAGE SENSOR INCLUDING LANDING STRUCTURE HAVING SAME MATERIAL AS GATE ELECTRODES

(71) Applicant: SAMSUNG ELECTRONICS CO., LTD., Suwon-si (KR)

(72) Inventors: Minho Jang, Suwo-si (KR); Doowon Kwon, Suwon-si (KR); Doyeon Kim, Suwon-si (KR); Kyungtae Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 498 days.

(21) Appl. No.: 18/203,677

(22) Filed: May 31, 2023

(65) Prior Publication Data

US 2024/0072091 A1 Feb. 29, 2024

(30) Foreign Application Priority Data

Aug. 31, 2022 (KR) ........................ 10-2022-0110185

(51) Int. Cl.
*H10F 39/00* (2025.01)
*H10W 90/00* (2026.01)
(Continued)

(52) U.S. Cl.
CPC ......... *H10F 39/809* (2025.01); *H10F 39/018* (2025.01); *H10F 39/811* (2025.01);
(Continued)

(58) Field of Classification Search
CPC .... H10F 39/018; H10F 39/809; H10F 39/811; H10W 72/90; H10W 80/312;
(Continued)

(56) References Cited

U.S. PATENT DOCUMENTS 10,910,426 B2 2/2021 Park et al.
10,923,607 B2 2/2021 Mizuta et al.
(Continued)

FOREIGN PATENT DOCUMENTS

CN 110211976 A * 9/2019 ............. H04N 25/79
CN 113169197 A 7/2021
(Continued)

OTHER PUBLICATIONS

Office Action in Korean Appln. No. 10-2022-0110185, mailed on May 6, 2026, 15 pages (with English translation).

*Primary Examiner* — Telly D Green
(74) *Attorney, Agent, or Firm* — Fish & Richardson P.C.

(57) ABSTRACT

An image sensor includes a lower substrate having a first surface and a second surface opposing the first surface, lower circuit devices disposed on the first surface, a lower wiring structure electrically connected to the lower circuit devices on the first surface, a lower bonding pad on the second surface, a lower bonding via penetrating through the lower substrate between the lower bonding pad and the lower wiring structure, a landing structure disposed on the first surface and contacting the lower bonding via, an upper bonding pad bonded to the lower bonding pad on the lower bonding pad, and an upper substrate disposed on the upper bonding pad and including photoelectric conversion devices. At least a portion of the landing structure horizontally overlaps the lower circuit devices.

20 Claims, 20 Drawing Sheets

1

'A'

(51) Int. Cl.
*H04N 25/77* (2023.01)
*H10W 80/00* (2026.01)

(52) U.S. Cl.
CPC ........... *H04N 25/77* (2023.01); *H10W 80/312* (2026.01); *H10W 80/327* (2026.01); *H10W 90/792* (2026.01)

(58) Field of Classification Search
CPC . H10W 80/327; H10W 90/792; H10W 99/00; H04N 25/77
See application file for complete search history.

(56) References Cited

U.S. PATENT DOCUMENTS

| | | | |
|---|---|---|---|
| 11,201,185 | B2 | 12/2021 | Mitsuhashi et al. |
| 2017/0040358 | A1 | 2/2017 | Kim et al. |
| 2017/0207158 | A1 | 7/2017 | Kang et al. |
| 2019/0148427 | A1 | 5/2019 | Lee |
| 2021/0217797 | A1 | 7/2021 | Hashiguchi et al. |
| 2022/0005853 | A1 | 1/2022 | Hagimoto |
| 2022/0028915 | A1 | 1/2022 | Jang et al. |
| 2022/0037388 | A1 | 2/2022 | Takizawa et al. |
| 2022/0077215 | A1 | 3/2022 | Horikoshi |
| 2022/0238487 | A1 * | 7/2022 | Shih ...................... H10W 90/00 |
| 2023/0039809 | A1 * | 2/2023 | Choi ..................... H10F 39/809 |

FOREIGN PATENT DOCUMENTS

| | | | | |
|---|---|---|---|---|
| JP | 2023024352 | A * | 2/2023 | ............ H10W 20/20 |
| KR | 10-2017-0018256 | A | 2/2017 | |
| KR | 10-2017-0086924 | A | 7/2017 | |
| KR | 10-2019-0038031 | A | 4/2019 | |
| KR | 10-2019-0054447 | A | 5/2019 | |
| KR | 10-2019-0131489 | A | 11/2019 | |
| KR | 10-2022-0022905 | A | 2/2022 | |
| WO | 2021/256142 | A1 | 12/2021 | |

* cited by examiner

1

393(393a)   395   392   393(393b)

391

PD                    PD

PI
FD
301

310 { 312
      315

322
321
324  } 320
323

307

380

'B'

290

ACT
201
215
222
221
280

245
207

223

232

132

113
101

180

107

120

2

393(393a)   395   392   393(393b)

391

PI
FD
301

PD          PD

310 { 312
      315

307

322
321
324

380

290

ACT
201
215

245'
207
222'
221'

280

226
225

232

180

131

107

115

101

120

IMAGE SENSOR INCLUDING LANDING STRUCTURE HAVING SAME MATERIAL AS GATE ELECTRODES

CROSS-REFERENCE TO RELATED APPLICATION(S)

A claim of priority under 35 U.S.C. § 119 is made to Korean Patent Application No. 10-2022-0110185 filed on Aug. 31, 2022 in the Korean Intellectual Property Office, the entirety of which is hereby incorporated by reference.

BACKGROUND

The present disclosure relates to image sensors.

An image sensor may be configured as a semiconductor-based sensor that receives light and generates an electrical signal. An image sensor may typically include a pixel array having a plurality of pixels, and a logic circuit driving the pixel array and generating an image. Each of the pixels may include a photodiode, and a pixel circuit that converts an electrical charge generated by the photodiode into an electrical signal.

SUMMARY

Embodiments of the inventive concepts provide an image sensor having increased integration density and improved electrical characteristics.

Embodiments of the inventive concepts provide an image sensor that includes a first chip structure including a first substrate, first circuit devices on the first substrate, and a first wiring structure electrically connected to the first circuit devices; a second chip structure including a second substrate disposed on the first chip structure and having a first surface facing the first chip structure and a second surface opposing the first surface, second circuit devices between the first surface and the first chip structure, the second circuit devices including gate electrodes, a second wiring structure electrically connected to the second circuit devices between the second circuit devices and the first chip structure, a lower bonding via penetrating through the second substrate, and a lower bonding pad on the lower bonding via; and a third chip structure including a third substrate disposed on the second surface of the second substrate and including photoelectric conversion devices, third circuit devices disposed between the second surface and the third substrate, a third wiring structure electrically connected to the third circuit devices between the third circuit devices and the second chip structure, an upper bonding via electrically connected to the third wiring structure, and an upper bonding pad bonded to the lower bonding pad below the upper bonding via. The second chip structure further includes a landing structure contacting a lower end of the lower bonding via, and the landing structure includes a same material as the gate electrodes of the second circuit devices.

Embodiments of the inventive concepts further provide an image sensor that includes a lower substrate having a first surface and a second surface opposing the first surface; lower circuit devices disposed on the first surface; a lower wiring structure electrically connected to the lower circuit devices on the first surface; a lower bonding pad on the second surface; a lower bonding via penetrating through the lower substrate between the lower bonding pad and the lower wiring structure; a landing structure disposed on the first surface and contacting the lower bonding via; an upper bonding pad bonded to the lower bonding pad on the lower bonding pad; and an upper substrate disposed on the upper bonding pad and including photoelectric conversion devices. At least a portion of the landing structure horizontally overlaps the lower circuit devices.

Embodiments of the inventive concepts still further provide an image sensor that includes a first chip structure including a first substrate, first circuit devices on the first substrate, and a first wiring structure electrically connected to the first circuit devices; a second chip structure including a second substrate disposed on the first chip structure and having a first surface facing the first chip structure and a second surface opposing the first surface, second circuit devices between the first surface and the first chip structure, the second circuit devices including gate electrodes, a second wiring structure electrically connected to the second circuit devices between the second circuit device and the first chip structure, a lower bonding via penetrating through the second substrate, and a lower bonding pad on the lower bonding via; and a third chip structure including a third substrate disposed on the second surface of the second substrate and including photoelectric conversion devices, third circuit devices disposed between the second surface and the third substrate, a third wiring structure electrically connected to the third circuit devices between the third circuit devices and the second chip structure, an upper bonding via electrically connected to the third wiring structure, and an upper bonding pad bonded to the lower bonding pad below the upper bonding via. A lower end of the lower bonding via is disposed at a higher level than a lower surface of the gate electrodes of the second circuit devices.

BRIEF DESCRIPTION OF DRAWINGS

The above and other aspects, features, and advantages of the inventive concepts will be more clearly understood from the following detailed description, taken in conjunction with the accompanying drawings.

DETAILED DESCRIPTION

Hereinafter, example embodiments will be described with reference to the accompanying drawings.

Throughout the present disclosure, directional terms such as "upper," "intermediate," "lower," and the like may be used herein to describe the relationship of one element or feature with another, and the inventive concepts should not be limited by these terms. Accordingly, these terms such as "upper," "intermediate," "lower," and the like may be replaced by other terms such as "first," "second," "third," and the like to describe the elements and features.

Also, as is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
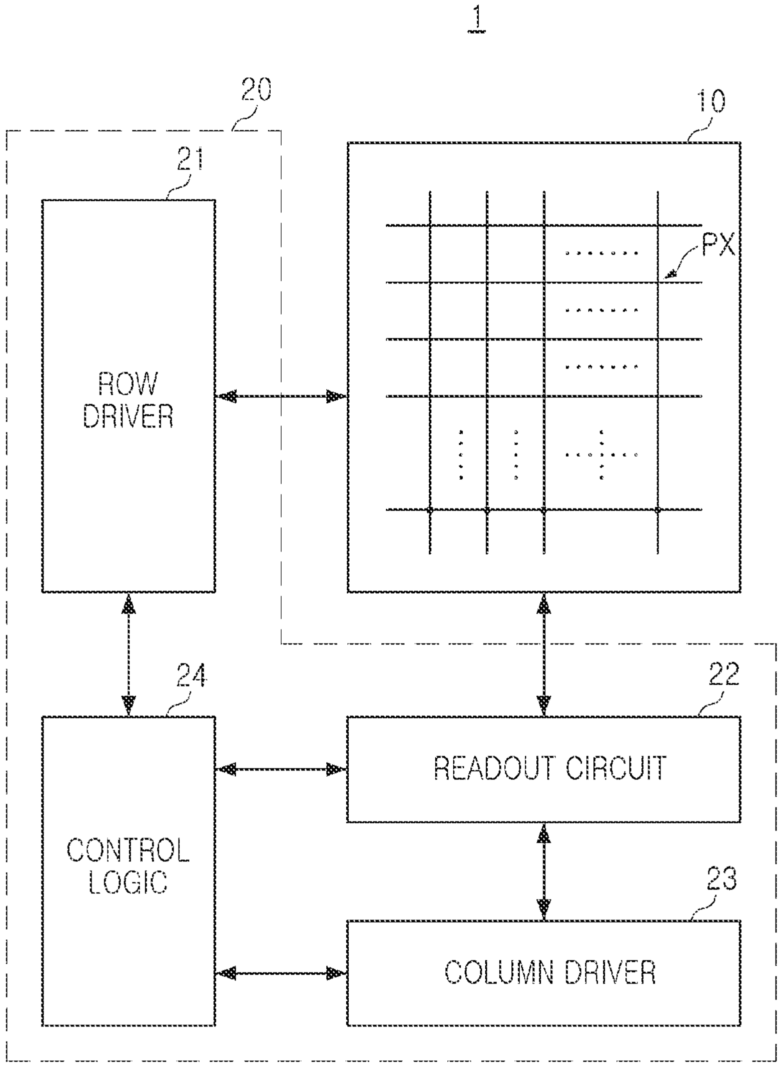
FIG. 1 illustrates a schematic block diagram of an image sensor according to embodiments of the inventive concepts.

FIG. 1 illustrates a schematic block diagram of an image sensor according to embodiments of the inventive concepts.

Referring to FIG. 1, an image sensor 1 may include a pixel array 10, a logic circuit 20, and the like. For example, image sensor 1 may include additional circuits although not here described or shown.

The pixel array 10 may include a plurality of pixels PX disposed in an array shape in a plurality of rows and a plurality of columns. Each of the plurality of pixels PX may include at least one photoelectric conversion device generating an electrical charge in response to light, and a pixel circuit generating a pixel signal corresponding to the electrical charge generated by the photoelectric conversion device. The photoelectric conversion device may include a photodiode formed of a semiconductor material, and/or an organic photodiode formed of an organic material. For example, the pixel circuit may include a floating diffusion region, a transfer transistor, a reset transistor, a driving transistor, and a select transistor.

The configuration of the plurality of pixels PX may vary according to example embodiments. In an example, each of the plurality of pixels PX may include an organic photodiode including an organic material or may be implemented as a digital pixel. The plurality of pixels PX implemented as digital pixels may each include an analog-to-digital converter outputting a digital pixel signal.

The logic circuit 20 may include circuits controlling the pixel array 10. In an example, the logic circuit 20 may include a row driver 21, a readout circuit 22, a column driver 23, a control logic (e.g., control logic circuit) 24, and the like. For example, the logic circuit 20 may include additional circuits not here described or shown. The row driver 21 may drive the pixel array 10 in units of row lines. For example, the row driver 21 may generate a transfer control signal that controls a transfer transistor of a pixel circuit, a reset control signal that controls a reset transistor, and a select control signal that controls a select transistor, and may input or provide the generated signals to the pixel array 10 in units of row lines.

The readout circuit 22 may include a correlated double sampler (CDS), an analog-to-digital converter (ADC), and the like. For example, the readout circuit 22 may include additional circuits not here described or shown. For example, the correlated double samplers may be connected to the plurality of pixels PX through column lines. The correlated double samplers may read pixel signals through column lines from the plurality of pixels PX connected to a row line selected by the row line select signal of the row driver 21. The analog-to-digital converters may convert a pixel signal, detected by a corresponding correlated double sampler, into a digital pixel signal and may transmit the digital pixel signal to the column driver 23.

The column driver 23 may include a latch or buffer circuit for temporarily storing a digital pixel signal, an amplifier circuit, and the like, and may process the digital pixel signal received from the readout circuit 22.

The row driver 21, the readout circuit 22, and the column driver 23 may be controlled by the control logic 24. The control logic 24 may include a timing controller that controls operation timings of the row driver 21, the readout circuit 22, and the column driver 23.

Among the plurality of pixels PX, pixels PX disposed in the same location in a horizontal direction may share the same column line. For example, pixels PX disposed in the same location in a vertical direction may be simultaneously selected by the row driver 21 and may output pixel signals through column lines.

In an embodiment, the readout circuit 22 may simultaneously obtain pixel signals from the plurality of pixels PX selected by the row driver 21 through column lines. The pixel signal may include a reset voltage and a pixel voltage, and the pixel voltage may be a voltage in which electrical charge generated in each of the pixels PX in response to light is reflected in the reset voltage.

Figure 2:
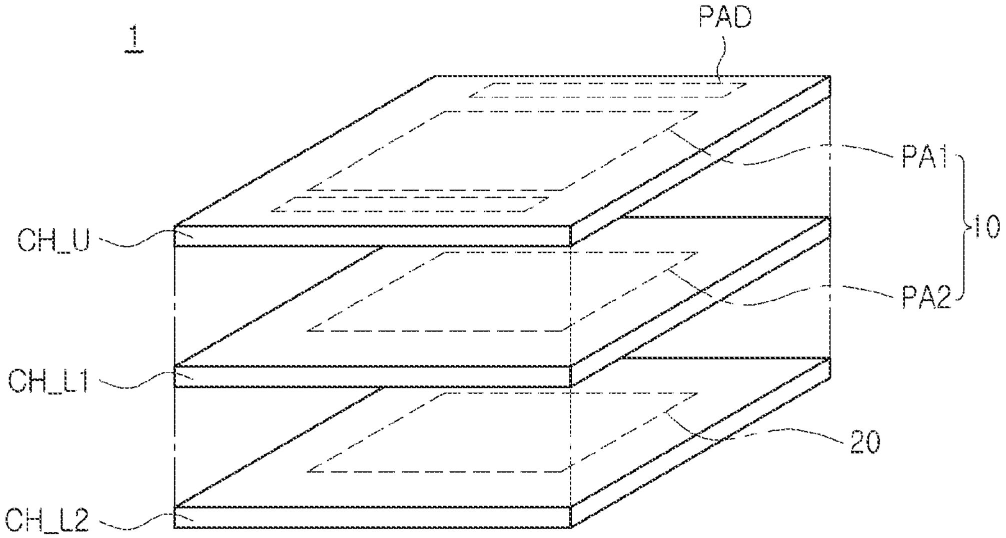
FIG. 2 illustrates a schematic perspective view of an image sensor according to embodiments of the inventive concepts.

An example of an image sensor 1 according to example embodiments will be described with reference to FIG. 2 together with FIG. 1. FIG. 2 illustrates a schematic perspective view of an image sensor 1 according to embodiments of the inventive concepts.

Referring to FIGS. 1 and 2, an image sensor 1 according to an example embodiment may include a plurality of chips stacked sequentially. For example, the plurality of chips include an upper chip CH_U, a first lower chip CH_L1 below the upper chip CH_U, and a second lower chip CH_L2 below the first lower chip CH_L1.

The first lower chip CH_L1 and the upper chip CH_U may include the pixel array 10, and the second lower chip CH_L2 may include the logic circuit 20.

Elements of each of the plurality of pixels (PX in FIG. 1), constituting the pixel array 10, may be divisionally disposed in the first lower chip CH_L1 and the upper chip CH_U. For example, the upper chip CH_U may include a first pixel region PA1, and the first lower chip CH_L1 may include a second pixel region PA2 vertically overlapping the first pixel region PA1.

The upper chip CH_U may further include a pad region PAD disposed on at least one side of the pixel array 10.

Figure 3A:
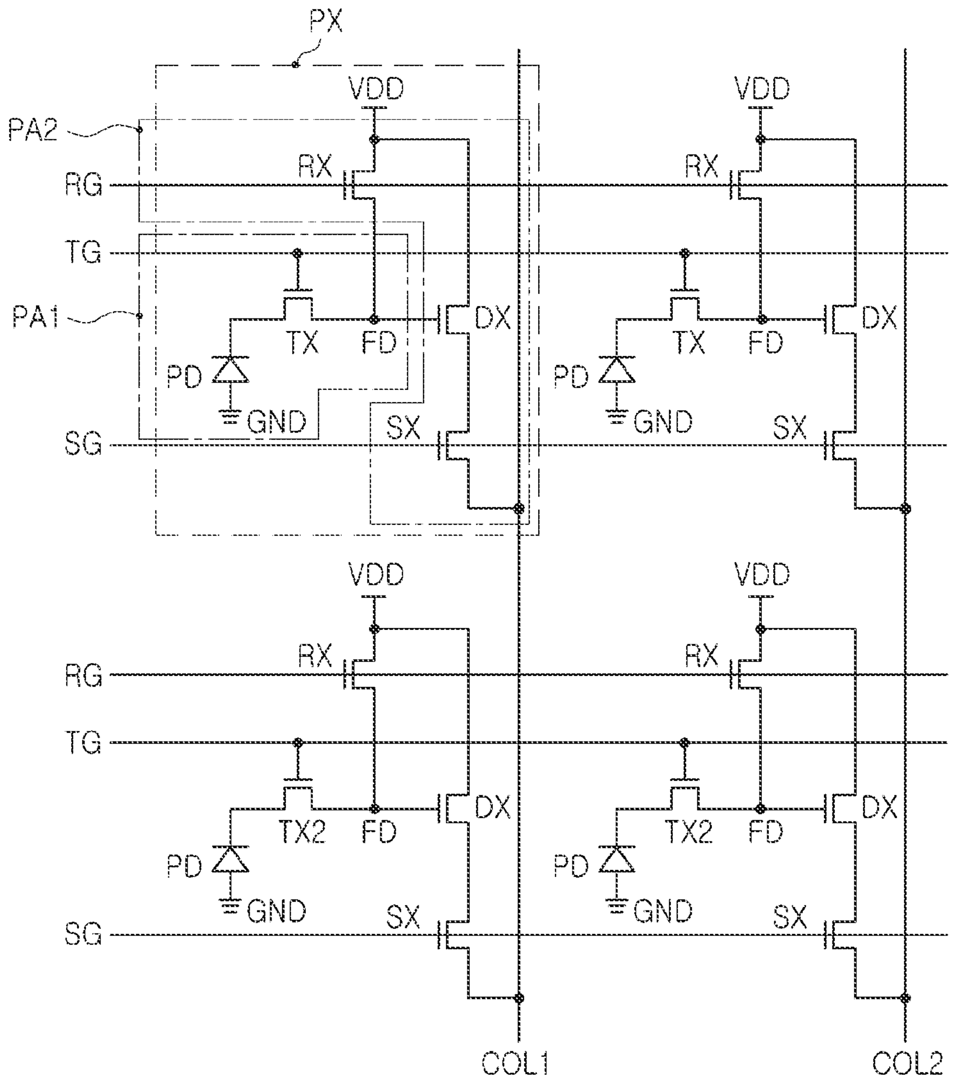
FIG. 3A illustrates a schematic diagram of an example of a pixel circuit of an image sensor according to embodiments of the inventive concepts.

An example of a pixel circuit of the image sensor 1 according to example embodiments will be described with reference to FIG. 3A together with FIGS. 1 and 2. FIG. 3A illustrates a schematic diagram of an example of a pixel circuit of an image sensor according to embodiments of the inventive concepts.

Referring to FIG. 3A together with FIGS. 1 and 2, each of the plurality of pixels (PX in FIG. 1) may include a photoelectric conversion device PD and a pixel circuit, and the pixel circuit may include a transfer transistor TX, a reset transistor RX, a select transistor SX, a driving transistor DX, and the like. The pixel circuit may further include a floating diffusion region FD in which charges generated by the photoelectric conversion device PD are accumulated.

Hereinafter, the photoelectric conversion device PD will be referred to as a photodiode (as an example of the photoelectric conversion device PD), and will be described.

The photodiode PD may generate and accumulate charges in response to externally incident light. According to example embodiments, the photodiode PD may be replaced with a phototransistor, a photogate, a pinned photodiode, or the like.

The transfer transistor TX may be turned on or turned off by a transfer control signal input to the transfer gate TG. The transfer transistor TX may transfer electrical charges generated by the photodiode PD to the floating diffusion region FD. The floating diffusion region FD may store the electrical charges generated by the photodiode PD. A voltage output from the driving transistor DX may vary depending on the amount of the electrical charges accumulated in the floating diffusion region FD.

The reset transistor RX may reset a voltage of the floating diffusion region FD by removing the electrical charges accumulated in the floating diffusion region FD. A drain electrode of the reset transistor RX may be connected to the floating diffusion region FD, and a source electrode of the reset transistor RX may be connected to a power supply voltage VDD. When the reset transistor RX is turned on responsive to a reset control signal input to the reset gate RG, the power supply voltage VDD connected to the source electrode of the reset transistor RX may be applied to the floating diffusion region FD, and the reset transistor RX may remove the electrical charges accumulated in the floating diffusion region FD.

The driving transistor DX may operate as a source follower buffer amplifier. The driving transistor DX may amplify a change in voltage of the floating diffusion region FD, and may output the amplified change to a single column line among column lines COL1 and COL2.

The select transistor SX may select pixels PX to be read in units of rows from among the plurality of pixels PX. When the select transistor SX is turned on responsive to a select control signal input to the select gate SG, a voltage of the driving transistor DX may be output to one of the column lines COL1 and COL2. As an example, when the select transistor SX is turned on, a reset voltage or a pixel voltage may be output through the column lines COL1 and COL2.

Each of the plurality of pixels PX may further include a ground region GND for receiving a ground voltage. Accordingly, each of the plurality of pixels PX may include a ground region GND, a photodiode PD, a transfer transistor TX, a reset transistor RX, a select transistor SX, and a driving transistor DX.

In each of the plurality of pixels PX, a transfer transistor TX, a photodiode PD including a ground region GND, and a transfer gate TG may be disposed in the first pixel region PA1 of the upper chip CH_U of FIG. 2, and the reset transistor RX, select transistor SX, and driving transistor DX may be disposed in the second pixel region PA2 of the first lower chip CH_L1 of FIG. 2.

Figure 3B:
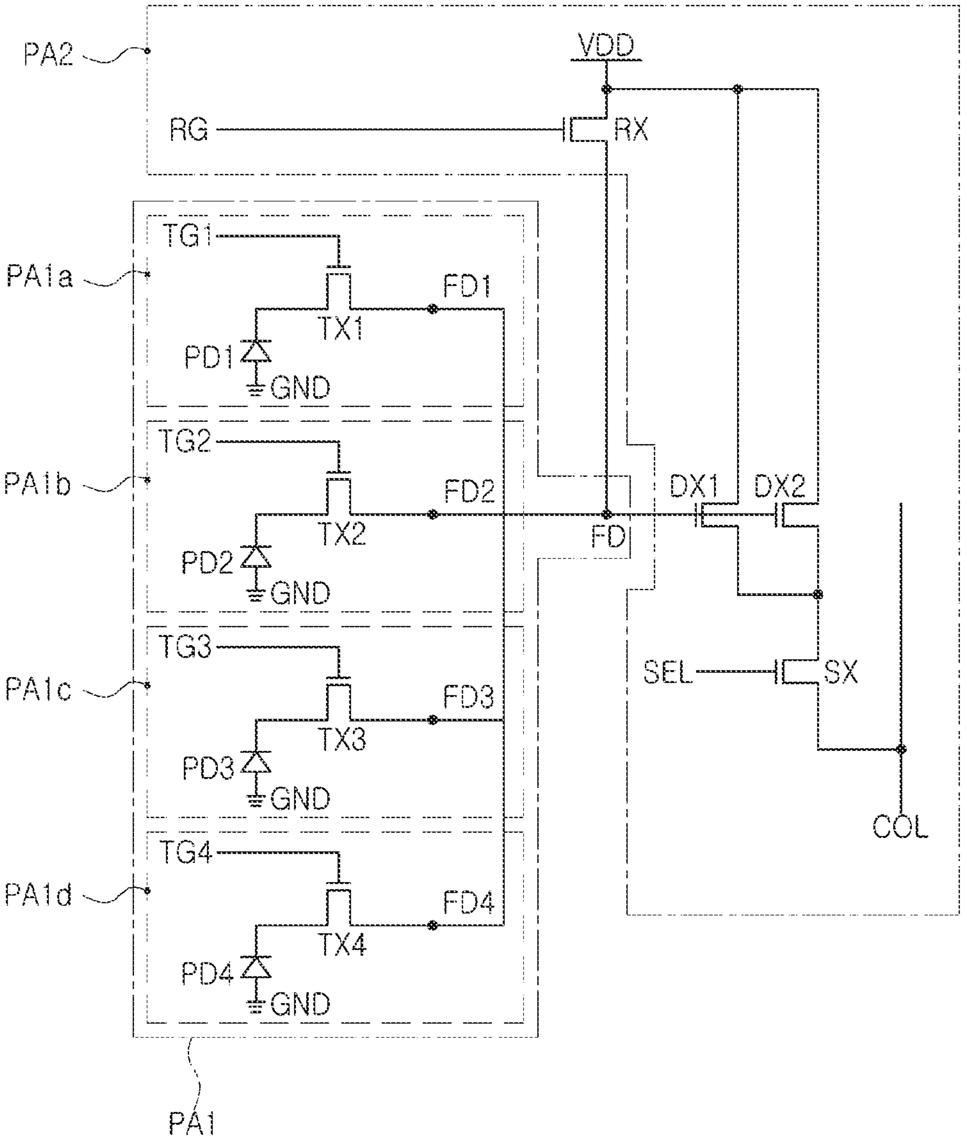
FIG. 3B illustrates a schematic diagram of another example of a pixel circuit of an image sensor according to embodiments of the inventive concepts.

Another example of a pixel circuit of the image sensor 1 according to example embodiments will be described with reference to FIG. 3B. FIG. 3B illustrates a schematic diagram of another example of a pixel circuit of an image sensor according to an embodiments of the inventive concepts.

Referring to FIG. 3B together with FIGS. 1 and 2, two or more adjacent pixels may share at least a portion of the transistors included in the pixel circuit. For example, four adjacent pixels may share a reset transistor RX, driving transistors DX1 and DX2, and a select transistor SX.

Each of the four adjacent pixels may include photodiodes PD1 to PD4, a ground region GND, transfer transistors TX1 to TX4 having transfer gates TG1 to TG4, and floating diffusion regions FD1 to FD4.

In an example, a first region PA1*a* in which a first pixel from among the four adjacent pixels is disposed may include a ground region GND, a first photodiode PD1, a first floating diffusion region FD1, and a first transfer transistor TX1 having a transfer gate TG1. In the first region PA1*a*, the first photodiode PD1 may be connected to the first floating diffusion region FD1 through the first transfer transistor TX1. Similarly, second to fourth photodiodes PD2 to PD4 of the second to fourth pixels from among the four adjacent pixels may be disposed in second to fourth regions PA1*b* to PA1*d*, and may be connected to the second to fourth floating diffusion regions FD2 to FD4 through second to fourth transfer transistors TX2 to TX4 having four transfer gates TG2 to TG4, respectively.

In the four adjacent pixels, the first to fourth floating diffusion regions FD1 to FD4 may be connected to each other by a wiring, or the like, to serve as a single floating diffusion region FD. The first to fourth transfer transistors TX1 to TX4 may be commonly connected to the single floating diffusion region FD connecting the fourth floating diffusion regions FD1 to FD4 to each other.

The pixel circuit may include a reset transistor RX, first and second driving transistors DX1 and DX2, and a select transistor SX. The reset transistor RX may be controlled by a reset control signal input to the reset gate RG, and the select transistor SX may be controlled by a select control signal input to the select gate SEL. For example, each of the four pixels PX may further include a single transistor, other than the transfer transistor TX. Among the four additional transistors included in the four pixels, two transistors may be connected in parallel to each other to provide first and second driving transistors DX1 and DX2, and one of the remaining two transistors may be provided as a select transistor SX and the other transistor thereof may be configured to provide a reset transistor RX.

The pixel circuit described with reference to FIG. 3B is only an example, and the inventive concepts are not limited to a type of pixel circuit as shown. For example, one of the four additional transistors other than the transfer transistors TX may be assigned as a driving transistor and another transistor thereof may be assigned as a select transistor. In addition, the remaining two transistors may be connected in series to be assigned as first and second reset transistors, and thus an image sensor for adjusting a conversion gain of a pixel may be implemented. Alternatively, the pixel circuit may vary depending on the number of transistors included in each of the pixels PX.

Hereinafter, an image sensor 1 according to example embodiments will be described with reference to FIGS. 4, 5, 6A, 6B, 7A, and 7B.

Figure 4:
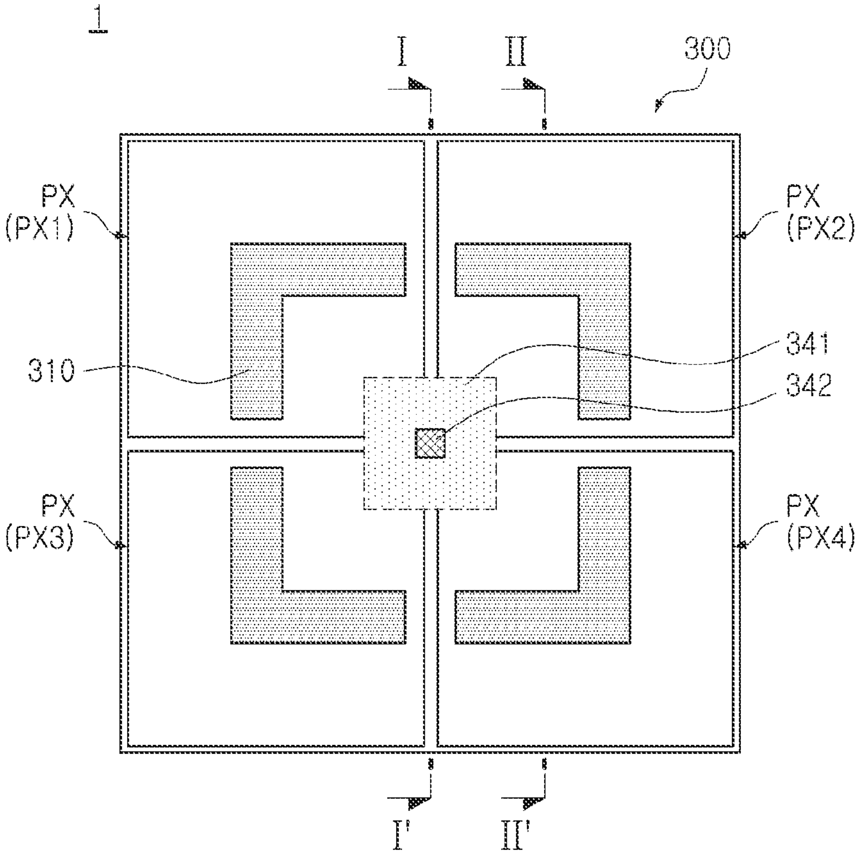
FIG. 4 illustrates a schematic plan view of an image sensor according to embodiments of the inventive concepts.
Figure 5:
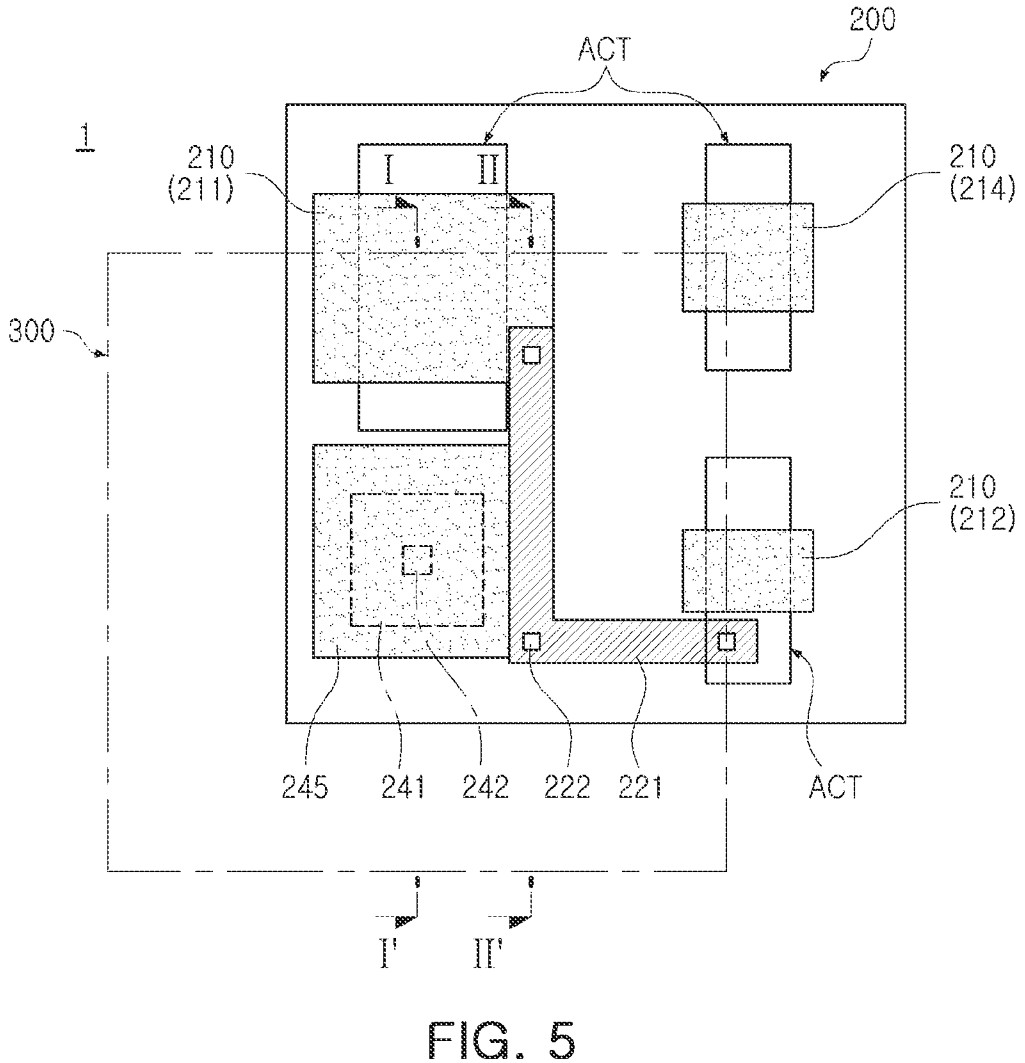
FIG. 5 illustrates another schematic plan view of the image sensor according to embodiments of the inventive concepts.

FIGS. 4 and 5 are schematic plan views of an image sensor according to embodiments of the inventive concepts. FIG. 4 illustrates a plan view of a unit region, and shows a portion of the first pixel region PA1 of the upper chip CH_U of FIG. 2. FIG. 5 illustrates a plan view of a unit region, and shows a portion of the second pixel region PA2 of the first lower chip CH_L1 of FIG. 2.

Figure 6A:
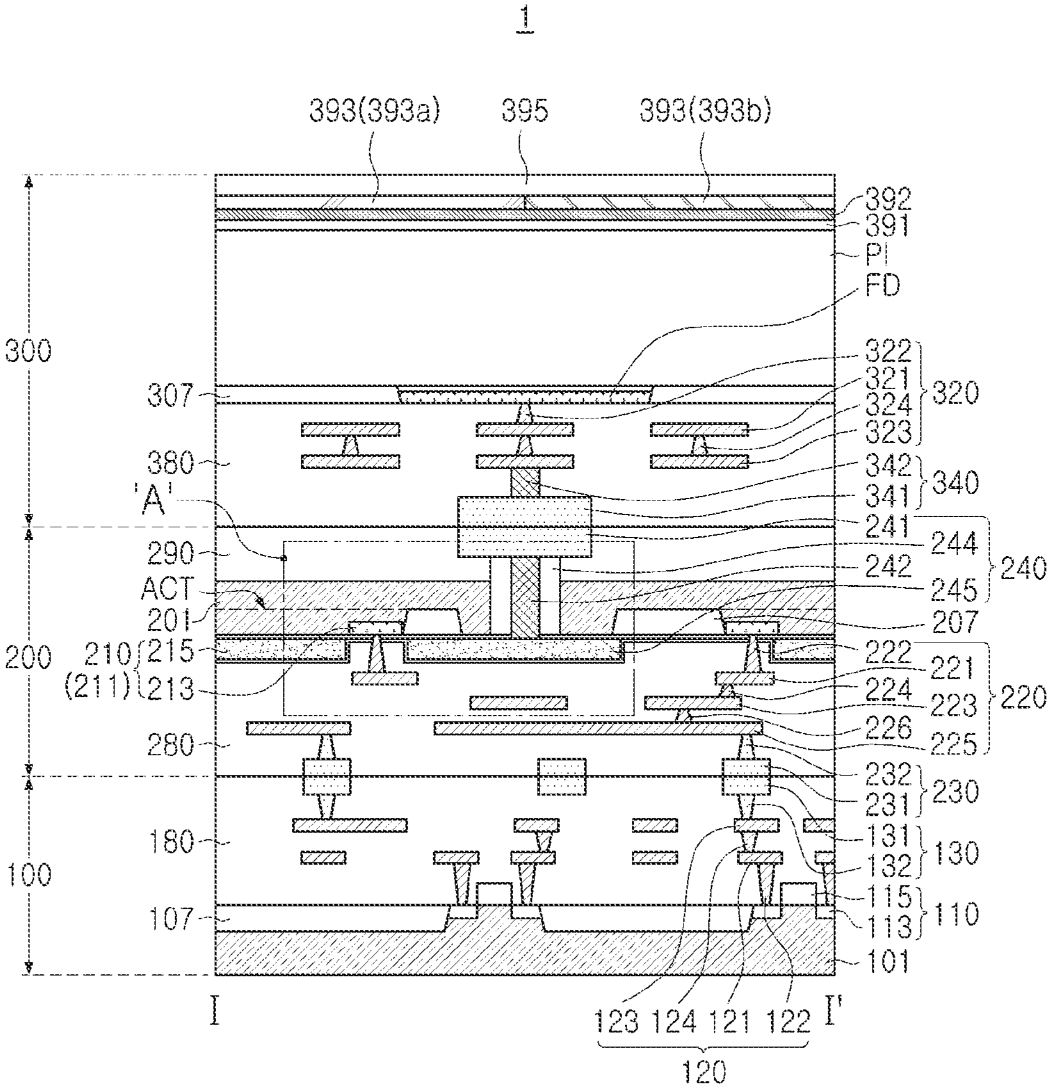
FIG. 6A illustrates a schematic cross-sectional view of an image sensor according to embodiments of the inventive concepts.
Figure 6B:
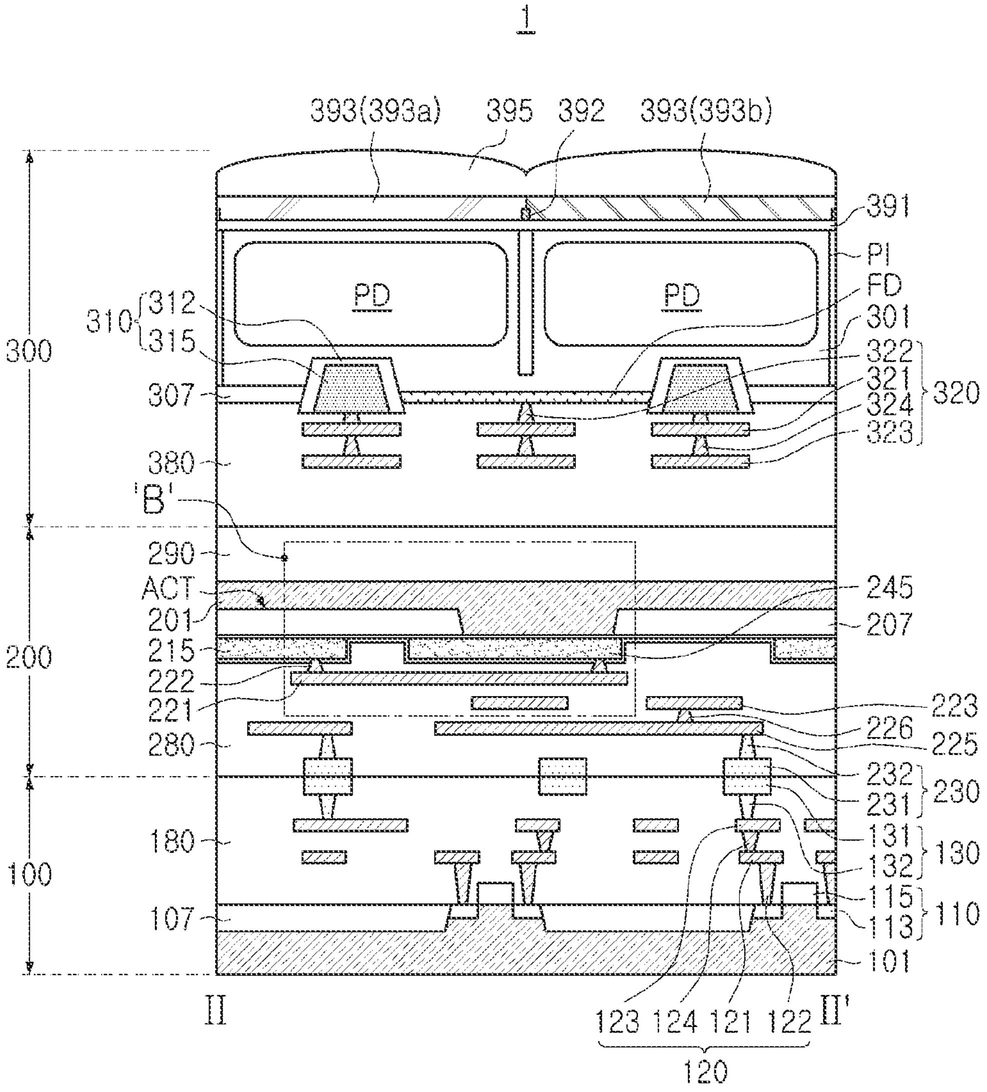
FIG. 6B illustrates another schematic cross-sectional view of the image sensor according to embodiments of the inventive concepts.

FIGS. 6A and 6B illustrate schematic cross-sectional views of an image sensor according to embodiments of the inventive concepts. FIG. 6A illustrates a cross-sectional view taken along line I-f of FIGS. 4 and 5, and FIG. 6B illustrates a cross-sectional view taken along line II-If of FIGS. 4 and 5.

Figure 7A:
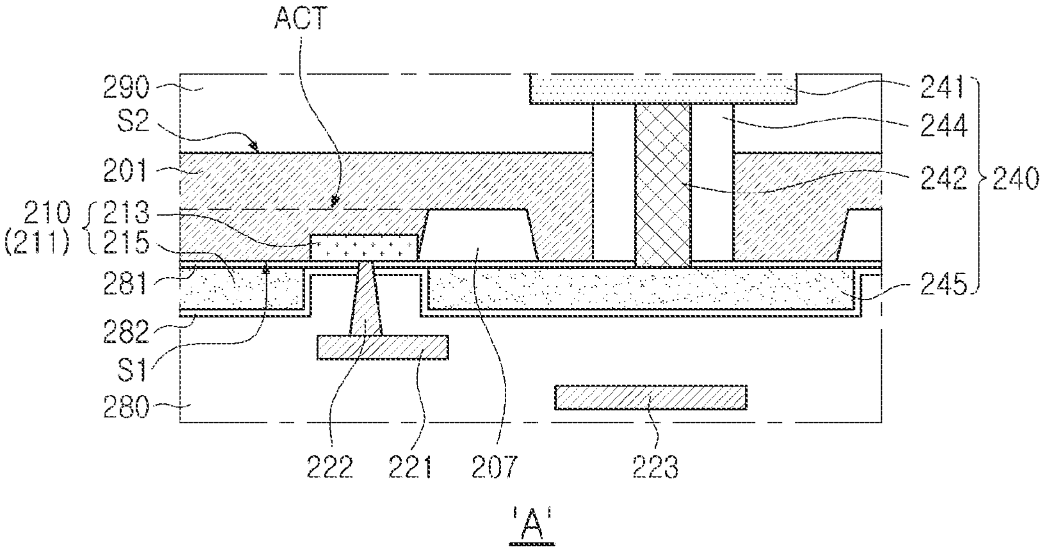
FIG. 7A illustrates a partially enlarged view of a portion of an image sensor according to embodiments of the inventive concepts.
Figure 7B:
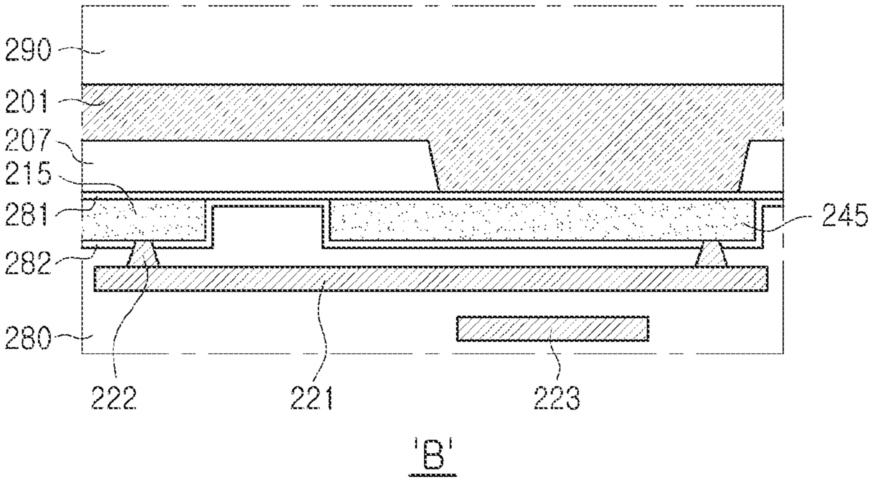
FIG. 7B illustrates another partially enlarged view of a portion of the image sensor according to embodiments of the inventive concepts.

FIGS. 7A and 7B illustrate partially enlarged views of an image sensor according to embodiments of the inventive concepts. FIG. 7A illustrates an enlarged view of region “A” of FIG. 6A, and FIG. 7B illustrates an enlarged view of region “B” of FIG. 6B.

Referring to FIGS. 4, 5, 6A, 6B, 7A, and 7B, an image sensor 1 according to example embodiments may include a first chip structure 100 including a first substrate 101, a second chip structure 200 including a second substrate 201, and a third chip structure 300 including a third substrate 301. The second chip structure 200 may be disposed on the first chip structure 100, and the third chip structure 300 may be disposed on the second chip structure 200. In an example embodiment, the first chip structure 100 may be a logic chip, and the second and third chip structures 200 and 300 may be image sensor chips including a plurality of pixels PX. The first chip structure 100 may be the second lower chip CH_L2 of FIG. 2, the second chip structure 200 may be the first lower chip CH_L1 of FIG. 2, and the third chip structure 300 may be the upper chip CH_U of FIG. 2. Similarly to that described with reference to FIGS. 2 and 3, the second chip structure 200 may include a reset transistor RX, a select transistor SX, and a driving transistor DX, and the third chip structure 300 may include a transfer transistor TX.

According to example embodiments, the first chip structure 100 may be a multilayer chip structure including a logic chip and a memory chip.

The first chip structure 100 of the image sensor 1 according to example embodiments may include a first isolation layer 107 defining an active region in the first substrate 101, first circuit devices 110 on the first substrate 101, a first wiring structure 120 electrically connected to the first circuit devices 110, a first bonding structure 130 on the first wiring structure 120, and a first insulating layer 180 covering the first circuit devices 110 and the first wiring structure 120 on the first substrate 101, in addition to the first substrate 101.

The first substrate 101 may be a semiconductor substrate. For example, the first substrate 101 may be a substrate formed of a semiconductor material, such as a single-crystalline silicon substrate. The first circuit devices 110 may include devices such as transistors including a first gate electrode 115 and a first source/drain region 113.

The first wiring structure 120 may apply electrical signals to the first circuit devices 110. The first wiring structure 120 may be electrically connected to the first source/drain region 113, and may also be electrically connected to the first gate electrode 115 in a region not illustrated. The first wiring structure 120 may include lower interconnection lines 121 and 123 disposed as a plurality of layers, and lower vias 122 and 124 disposed between the lower interconnection lines 121 and 123 or between the lower interconnection lines 121 and 123 and the first substrate 101. Each of the lower vias 122 and 124 may have a columnar shape and may have an inclined side surface having a width decreasing in a direction toward the first substrate 101.

In an example embodiment, the first wiring structure 120 may include the first lower interconnection line 121 on (or over) the first substrate 101, the first lower via 122 between the first lower interconnection line 121 and the first substrate 101, the second lower interconnection line 123 on (or over) the first lower interconnection line 121, and the second lower via 124 between first lower interconnection line 121 and second lower interconnection line 123. However, the number of interconnection lines constituting the first wiring structure 120, the number of vias, and an arrangement relationship of the interconnection lines may vary according to example embodiments.

The first bonding structure 130 may be electrically connected to the first wiring structure 120 on the first wiring structure 120. The first bonding structure 130 may include a metal material such as copper (Cu). The first bonding structure 130 may include a lower bonding pad 131 and a first bonding via 132 electrically connected to the first bonding pad 131. The first bonding pad 131 and the first bonding via 132 may be separately formed by a single damascene process, or may be integrally formed by a dual damascene process. The first bonding pad 131 of the first chip structure 100 may serve as a bonding layer to the second chip structure 200, and may provide an electrical connection path to the second chip structure 200. The first bonding pads 131 may be provided in plural. For example, a portion or some of the first bonding pads 131 may not be connected to an underlying first wiring structure 120 and may be disposed for only bonding, as illustrated in FIG. 6A.

The first insulating layer 180 may cover a portion of the first bonding structure 130 while covering the first circuit devices 110 and the first wiring structure 120. The first insulating layer 180 may expose an upper surface of the first bonding pad 131 while covering a lower surface and side surfaces of the first bonding pad 131. For example, an upper surface of the first insulating layer 180 may be coplanar with an upper surface of the first bonding pad 131 or substantially coplanar with an upper surface of the first bonding pad 131. In an example embodiment, the first insulating layer 180 may include a bonding insulating layer (not shown) having a predetermined thickness from the upper surface. The bonding insulating layer may be a layer for dielectric-to-dielectric bonding to the bonding insulating layer of the second chip structure 200. The bonding insulating layer may serve as a diffusion barrier layer of the first bonding pad 231 and may include at least one of, for example, SiO, SiN, SiCN, SiOC, SiON, or SiOCN.

The second chip structure 200 of the image sensor 1 according to example embodiments may include a second substrate 201 having a first surface S1 facing the first chip structure 100 and a second surface S2 opposing the first surface S1 (see FIG. 7A), a second isolation layer 207 defining the active region ACT in the second substrate 201, second circuit devices 210 on the first surface S1 of the second substrate 201, a second wiring structure 220 electrically connected to the second circuit devices 210, a second lower bonding structure 230 on (or over) the first surface S1 of the second substrate 201, a second upper bonding structure 240 on the second surface S2 of the second substrate 201, a second lower insulating layer 280 on the first surface S1 of the second substrate 201, and a second upper insulating layer 290 on the second surface S2 of the second substrate 201.

The second substrate 201 may be a semiconductor substrate. For example, the second substrate 201 may be a substrate formed of a semiconductor material, for example, a single-crystalline silicon substrate. In the present specification, the second substrate 201 may be referred to as a "lower substrate."

Referring to FIGS. 5 and 6A, the active region ACT may be defined by the second isolation layer 207 in the second substrate 201. The second source/drain region 213 may be a doped region formed in the active region ACT. In an example embodiment, a portion of a regions partitioned by the second isolation layer 207 may be dummy active regions which do not constitute a transistor. For example, the dummy active region may include a region adjacent to a region in which a landing structure 245 or a third bonding via 242 is formed.

The second circuit devices 210 may include a device such as a transistor including a second gate electrode 215 and a second source/drain region 213. The second gate electrode 215 may include a semiconductor material such as silicon, germanium, or a combination thereof. The second gate electrode 215 may include an N-type or P-type doped layer. Alternatively, the second gate electrode 215 may include an undoped layer. In an example embodiment, the second circuit devices 210 may include a first intermediate device 211, a second intermediate device 212, and a third intermediate device 214 (e.g., see FIG. 5). The first intermediate device 211 may be one of the driving transistors DX1 and DX2 of FIG. 3B, the second intermediate device 212 may be the reset transistor RX of FIG. 3B, and the third intermediate device 214 may be the select transistor SX of FIG. 3B. However, the type and disposition relationship of the second circuit devices 210 may vary. In the present specification, the second circuit devices 210 may be referred to as "lower circuit devices."

The second wiring structure 220 may be disposed between the second substrate 201 and the first chip structure 100. The second wiring structure 220 may apply electrical signals to the second circuit devices 210. The second wiring structure 220 may be electrically connected to the second source/drain region 213, and may also be electrically connected to the second gate electrode 215 in a region not illustrated. The second wiring structure 220 may include intermediate interconnection lines 221, 223, and 225 disposed as a plurality of layers, and intermediate vias 222, 224, and 226 disposed between the intermediate interconnection lines 221, 223, and 225 or between the intermediate lines 221, 223, and 225 and the second substrate 201. Each of the intermediate vias 222, 224, and 226 may have a columnar shape and may have an inclined side surface having a width decreasing in a direction toward the second substrate 201. In this case, a direction in which side surfaces of the intermediate vias 222, 224 and 226 are inclined may be different from the direction in which the side surfaces of the lower vias 122 and 124 are inclined. However, according to example embodiments, the intermediate vias 222, 224, and 226 and the lower vias 122 and 124 may have side surfaces vertically extending while having a constant width.

In an example embodiment, the second wiring structure 220 may include a first intermediate interconnection line 221 on (or over) the first surface S1 of the second substrate 201, a first intermediate via 222 between the first intermediate interconnection line 221 and the second substrate 201, a second intermediate interconnection line 223 below the first intermediate interconnection line 221, a second intermediate via 224 between the first intermediate interconnection line 221 and the second intermediate interconnection line 223, a third intermediate interconnection line 225 below the second intermediate interconnection line 223, and a third intermediate via 226 between the second intermediate interconnection line 223 and the third intermediate interconnection line 225. However, the number of interconnection lines and vias constituting the second wiring structure 220 may vary according to example embodiments. In the present specification, the second wiring structure 220 may be referred to as a "lower wiring structure."

In an example embodiment, the second chip structure 200 may further include first and second insulating liners 281 and 282. The first insulating liner 281 may be conformally formed on the first surface S1 of the second substrate 201. The second insulating liner 282 may be disposed between the first insulating liner 281 and the second gate electrode 215, and the second lower insulating layer 280. The second insulating liner 282 may be disposed between the landing structure 245 and the second lower insulating layer 280. For example, the first insulating liner 281 may include a silicon oxide or a low dielectric material, and the second insulating liner 282 may include a silicon nitride. A portion of the first insulating liner 281 may serve as a gate dielectric layer of the second circuit devices 210, and the first and second insulating liners 282 may serve as an etch-stop layer of the second wiring structure 220.

The second lower bonding structure 230 may be electrically connected to the second wiring structure 220 below the second wiring structure 220. The second lower bonding structure 230 may be a structure for bonding to the first chip structure 100. The second lower bonding structure 230 may include a metal material such as copper (Cu). The second lower bonding structure 230 may include a second bonding pad 231 and a second bonding via 232 electrically connected to the second bonding pad 231. The second bonding pad 231 and the second bonding via 232 may be separately formed by a single damascene process, or may be integrally formed by a dual damascene process. The second bonding pad 231 of the second chip structure 200 may be in contact with the first bonding pad 131 of the first chip structure 100. The second bonding pad 231 may serve as a bonding layer and may provide an electrical connection path to the first chip structure 100. The second bonding pad 231 may be provided in plural. For example, as illustrated in FIG. 6A, a portion or some of the second bonding pads 231 may be disposed only for bonding without being electrically connected to the upper second wiring structure 220.

The second lower insulating layer 280 may cover a portion of the second lower bonding structure 230 while covering the second circuit devices 210 and the second wiring structure 220 on the first surface S1 of the second substrate 201. The second lower insulating layer 280 may expose a lower surface of the second bonding pad 231 while covering upper and side surfaces of the second bonding pad 231. For example, a lower surface of the second lower insulating layer 280 may be substantially coplanar with the lower surface of the second bonding pad 231. In an example embodiment, the second lower insulating layer 280 may include a bonding insulating layer (not shown) having a predetermined thickness from the lower surface thereof. The insulating bonding layer may be a layer for dielectric-to-dielectric bonding to the insulating bonding layer of the first chip structure 100.

The second upper bonding structure 240 may be a structure for bonding to the third chip structure 300. The second upper bonding structure 240 may include a third bonding pad 241 on (or over) the second surface S2 of the second substrate 201 and a landing structure 245 disposed on the first surface S1 of the second substrate 201, and a third bonding via 242 disposed between the third bonding pad 241 and the landing structure 245. The third bonding pad 241 may include a metal material such as copper (Cu), and the third bonding via 242 may include a metal material such as copper (Cu) or tungsten (W). The third bonding pad 241 may include the same metal material as the third bonding via 242, but example embodiments are not limited thereto.

The third bonding pad 241 may be spaced apart from the second substrate 201 on the second surface S2 of the second substrate 201. The third bonding via 242 may be a through-via penetrating through the second substrate 201. An upper end of the third bonding via 242 may be in contact with the third bonding pad 241, and a lower end of the third bonding via 242 may be in contact with the landing structure 245. In the present specification, a "lower end" may refer to one end in a direction toward the first substrate 101, and an "upper end" may refer to one end in a direction away from the first substrate 101. The upper end of the third bonding via 242 may be disposed at a level higher than a level of the second surface S2 of the second substrate 201, and the lower end of the third bonding via 242 may be disposed at a level higher than a level of the lower end of the first intermediate via 222. In the present specification, a "level" may refer to a distance from an upper surface of the first substrate 101. A lower end of the third bonding via 242 may be disposed at a level higher than a level of a lower surface of the second gate electrode 215. The third bonding via 242 may have a columnar shape having a side surface extending vertically and having a constant width. However, according to example embodiments, the third bonding via 242 may have a shape in which a width decreases in a direction toward the end upper end from the lower end, and may have a pillar shape having an inclined side surface. In the present specification, the third bonding pad 241 may be referred to as a "lower bonding pad" and the third bonding via 242 may be referred to as a "lower bonding via".

In an example embodiment, the second upper bonding structure 240 may further include an insulating spacer 244 between the third bonding via 242 and the second substrate 201. The third bonding via 242 may be spaced apart from the second substrate 201 by the insulating spacer 244. An external side surface of the insulating spacer 244 may be surrounded by the second substrate 201, and a lower surface of the insulating spacer 244 may be covered with the landing structure 245. A lower surface of the insulating spacer 244 may be coplanar with the first surface S1 of the second substrate 201.

As illustrated in FIG. 5, the landing structure 245 may have a planar area larger than a planar area of the third bonding via 242. In an example embodiment, the landing structure 245 may have a planar area larger than a planar area of the third bonding pad 241. However, example embodiments are not limited thereto, and the land structure 245 may have a planar area smaller than a planar area of the third bonding pad 241.

The landing structure 245 may be disposed at a level higher than a level of the first intermediate interconnection line 221. For example, the landing structure 245 may be disposed to be closer to the second substrate 201 than to the first intermediate interconnection line 221. A lower surface of the landing structure 245 may be disposed at a level higher than a level of a lower surface of the first intermediate via 222. The landing structure 245 may include a portion overlapping at least a portion of the second circuit devices 210 in a horizontal direction. In an example embodiment, the landing structure 245 may be disposed to be parallel to the second circuit devices 210 on the same level as the second gate electrode 215 of the second circuit devices 210 or on substantially the same level as the second gate electrode 215 of the second circuit devices 210. Accordingly, a length of the landing structure 245 may be the same as a length of the second gate electrode 215 of the second circuit devices 210 in a vertical direction perpendicular to the first substrate 101, or may be substantially the same as a length of the second gate electrode 215 of the second circuit devices 210 in a vertical direction perpendicular to the first substrate 101. For example, a thickness of the landing structure 245 and a thickness of the second circuit devices 210 in the vertical direction may be substantially the same.

The landing structure 245 may include a semiconductor material. The landing structure 245 may include the same material as the second gate electrode 215 of each of the second circuit devices 210. The landing structure 245 may include, for example, polycrystalline silicon.

The landing structure 245 may be a region formed in the same process as the second gate electrode 215 of the second circuit devices 210 and separated from the second circuit devices 210 by patterning. Accordingly, the landing structure 245 may have the same material and the same height as the second gate electrode 215.

In an example embodiment, the landing structure 245 may be spaced apart from the second circuit devices 210, but example embodiments are not limited thereto.

Referring to FIGS. 5, 6A, and 6B, the landing structure 245 is disposed on a level different from a level of the first intermediate interconnection line 221, for example a level higher than a level of the first intermediate interconnection line 221, so that a degree of freedom in wiring of the first intermediate interconnection line 221 may be improved. The degree of freedom in wiring may refer to, for example, a degree of closeness between wirings in a layout operation for wiring arrangement or a process margin in an operation for wiring formation. Accordingly, the image sensor 1 having an increased degree of integration may be realized in accordance with embodiments of the inventive concepts.

In the image sensor 1 according to example embodiments, the landing structure 245 may be disposed on a level different from a level of the first intermediate interconnection line 221, to thus reduce parasitic capacitance which may be formed in cases that the landing structure 245 is formed at the same level as the intermediate interconnection line 221. For example, an image sensor 1 having improved electrical characteristics may be provided using the landing structure 245 according to the present embodiment, rather than a landing wire disposed at the same level as the first intermediate interconnection line 221 and having a plane area corresponding to the area of the landing structure 245 of FIG. 5. In addition, the lower end of the third bonding via 242 may be disposed at a level higher than a level of the first intermediate interconnection line 221, to thus reduce parasitic capacitance between the third bonding via 242 and the second wiring structure 220. Accordingly, the image sensor 1 having improved electrical characteristics may be provided.

The second upper insulating layer 290 may cover the second substrate 201 on the second surface S2 of the second substrate 201. The second upper insulating layer 290 may expose an upper surface of the third bonding pad 241 while covering the lower and side surfaces of the third bonding pad 241. For example, an upper surface of the second upper insulating layer 290 may be substantially coplanar with the upper surface of the third bonding pad 241. In an example embodiment, the third lower insulating layer 290 may include a bonding insulating layer (not shown) having a predetermined thickness from the upper surface thereof. The bonding insulating layer may be a layer for dielectric-to-dielectric bonding to the bonding insulating layer of the third chip structure 300.

The third chip structure 300 of the image sensor 1 according to example embodiments may include the third substrate 301 having a third surface facing the second chip structure 200 and a fourth surface opposing the third surface, a third isolation layer 307 disposed on the third surface of the third substrate 301 and defining an active region, third circuit devices 310 disposed on the third surface of the third substrate 301, a third wiring structure 320 electrically connected to the third circuit devices 310, a third bonding structure 340 below the third wiring structure 320, and a third insulating layer 380 covering the third circuit devices 310 and the third wiring structure 320 between the third surface of the third substrate 301 and the second chip structure 200.

In an example embodiment, the third chip structure 300 may include a horizontal insulating layer 391 disposed on the fourth surface of the third substrate 301, a grid pattern 392 on the horizontal insulating layer 391, horizontal color filters 393 covering the insulating layer 391 and the grid pattern 392, and microlenses 395 on the color filters 393.

The third substrate 301 may be a semiconductor substrate. For example, the third substrate 301 may be a substrate formed of a semiconductor material, for example, a single-crystalline silicon substrate. The third surface of the third substrate 301 may be in contact with the third insulating layer 380.

Photoelectric conversion devices PD may be disposed in the third substrate 301. The photoelectric conversion devices PD may generate and accumulate charges corresponding to incident light. For example, the photoelectric conversion devices PD may include a photodiode, a phototransistor, a photogate, a pinned photodiode (PPD), and/or a combination thereof. In the present specification, the third substrate 301 may also be referred to as an "upper substrate."

In an example embodiment, the third chip structure 300 may further include a separation structure PI. The separation structure PI may be disposed to surround each of the photoelectric conversion devices PD. At least a portion of the separation structure PI may penetrate through the third substrate 301. In some embodiments the separation structure PI may be connected to the third isolation layer 307. The separation structure PI may include a separation pattern of polycrystalline silicon and a separation insulating layer of a silicon oxide surrounding side surfaces of the separation pattern, but materials forming the separation structure PI and the number of layers thereof are not limited thereto and may vary according to example embodiments.

The third isolation layer 307 may be disposed on the third surface of the third substrate 301 and may define an active region. A portion of the active region may include a floating diffusion region FD. The floating diffusion region FD may perform functions the same as or similar to the functions of the floating diffusion region FD of FIG. 3B.

Each of the third circuit devices 310 may include a third gate electrode 315 and a gate dielectric layer 312 between the third gate electrode and the third substrate 301. Each of the third circuit devices 310 may transfer charges from an adjacent photoelectric conversion device PD to an adjacent floating diffusion region PD. In an example embodiment, each of the third circuit devices 310 may be the transfer transistor TX of FIG. 3B. In the present specification, the third circuit devices 310 may be referred to as "upper circuit devices."

The third wiring structure 320 may apply electrical signals to the third circuit devices 310. The third wiring structure 320 may include upper interconnection lines 321 and 323 and upper vias 322 and 324 disposed on different height levels. The upper vias 322 and 324 may have a column shape. Each of the upper vias 322 and 324 may have an inclined side surface having a width decreasing in a direction toward the third substrate 301, but may have a side surface extending vertically with a constant width.

In an example embodiment the third wiring structure 320 may include a first upper interconnection line 321 on (or over) the third surface of the third substrate 301, a first upper via 322 between the first upper interconnection line 321 and the third substrate 301, a second upper interconnection line 323 below the first upper interconnection line 321, and a second upper via 324 between the first upper interconnection line 321 and the second upper interconnection line 323. However, the number of interconnection lines and vias constituting the third wiring structure 320 may vary according to example embodiments. In the present specification, the third wiring structure 320 may be referred to as an "upper wiring structure."

The third bonding structure 340 may be electrically connected to the third wiring structure 320 below the third wiring structure 320. The third bonding structure 340 may be a structure for bonding to the second chip structure 200. The third bonding structure 340 may include a fourth bonding pad 341 and a fourth bonding via 342 electrically connected to the fourth bonding pad 341. The fourth bonding pad 341 may include a metal material such as copper (Cu), and the fourth bonding via 342 may include a metal material such as copper (Cu) or tungsten (W). The fourth bonding pad 341 may include the same metal material as the fourth bonding via 342, but example embodiments are not limited thereto. In the present specification, the fourth bonding pad 341 may be referred to as an "upper bonding pad" and the fourth bonding via 342 may be referred to as an "upper bonding via."

The fourth bonding pad 341 may be in contact with the third bonding pad 241. The fourth bonding pad 341 may serve as a bonding layer and may provide an electrical connection path to the second chip structure 200.

The third insulating layer 380 may cover a portion of the third bonding structure 340 while covering the third circuit devices 310 and the third wiring structure 320 on the third surface of the third substrate 301. The third insulating layer 380 may expose a lower surface of the fourth bonding pad 341 while covering upper and side surfaces of the fourth bonding pad 341. In an example embodiment, the third insulating layer 380 may include a bonding insulating layer having a predetermined thickness from a lower surface thereof.

The horizontal insulating layer 391 may cover the third substrate 301 on the fourth surface of the third substrate 301. The horizontal insulating layer 391 may cover the separation structure PI.

In an example embodiment, the horizontal insulating layer 391 may include a plurality of layers (not shown) stacked sequentially. The horizontal insulating layer 391 may include an antireflection layer for preventing reflection of light which may occur due to a rapid change in refractive index on the fourth surface of the third substrate 301 which may be formed of silicon. For example, the horizontal insulating layer 391 may include at least two layers, among an aluminum oxide layer, a hafnium oxide layer, a silicon oxynitride layer, a silicon oxide layer, and a silicon nitride layer. For example, the horizontal insulating layer 391 may include first to fourth layers stacked sequentially. The first layer may be an aluminum oxide layer, each of the second and fourth layers may be a hafnium oxide layer, and the third layer may be a silicon oxide layer.

The grid pattern 392 may be disposed on the horizontal insulating layer 391. In plan view, the grid pattern 392 may be disposed between the plurality of pixels PX. At least a portion of the grid pattern 392 may vertically overlap the separation structure PI. The grid pattern 392 may include an oxide or nitride including an insulating material such as a low refractive index (LRI) material such as Si, Al, or a combination thereof. Also, the grid pattern 392 may include a porous silicon oxide or silica nanoparticles having a network structure.

The color filters 393 may be disposed on the horizontal insulating layer 391 to cover the horizontal insulating layer 391 and the grid pattern 392. The color filters 393 may pass light having a specific wavelength to reach the photoelectric conversion devices PD. Each of the color filters 393 may vertically overlap each of the pixels PX. The color filters 393 may be formed of, for example, a material obtained by mixing a resin with a pigment containing a metal or a metal oxide.

The color filters 393 may include first to third color filters including color filters 393*a* and 393*b* shown in FIGS. 6A and 6B, and third color filters (not shown), having different colors. The first to third color filters including color filters 393*a* and 393*b*, and the third color filters (not shown), may include first color filters 393*a* having a first color, second color filters 393*b* having a second color different from the first color, and third color filters having a third color different from the first and second colors. For example, the first color may be a green color, the second color may be a red color, and the third color may be a blue color.

The microlenses 395 may be disposed on the color filters 393. Each of the microlenses 395 may have a convex shape in a direction away from the first chip structure 100. The microlenses 395 may condense incident light into the photoelectric conversion devices PD. The microlenses 395 may be formed of a transparent photoresist material or a transparent thermosetting resin material. For example, the microlenses 395 may be formed of a TMR-based resin (manufactured by Tokyo Ohka Kogo, Co.) or an MFR-based resin (manufactured by Japan Synthetic Rubber Corporation), but example embodiments are not limited to such materials.

In an example embodiment, each of the microlenses 395 may vertically overlap each of the color filters 393.

Hereinafter, various modified examples of the components of the above-described image sensor will be described.

Figure 8:
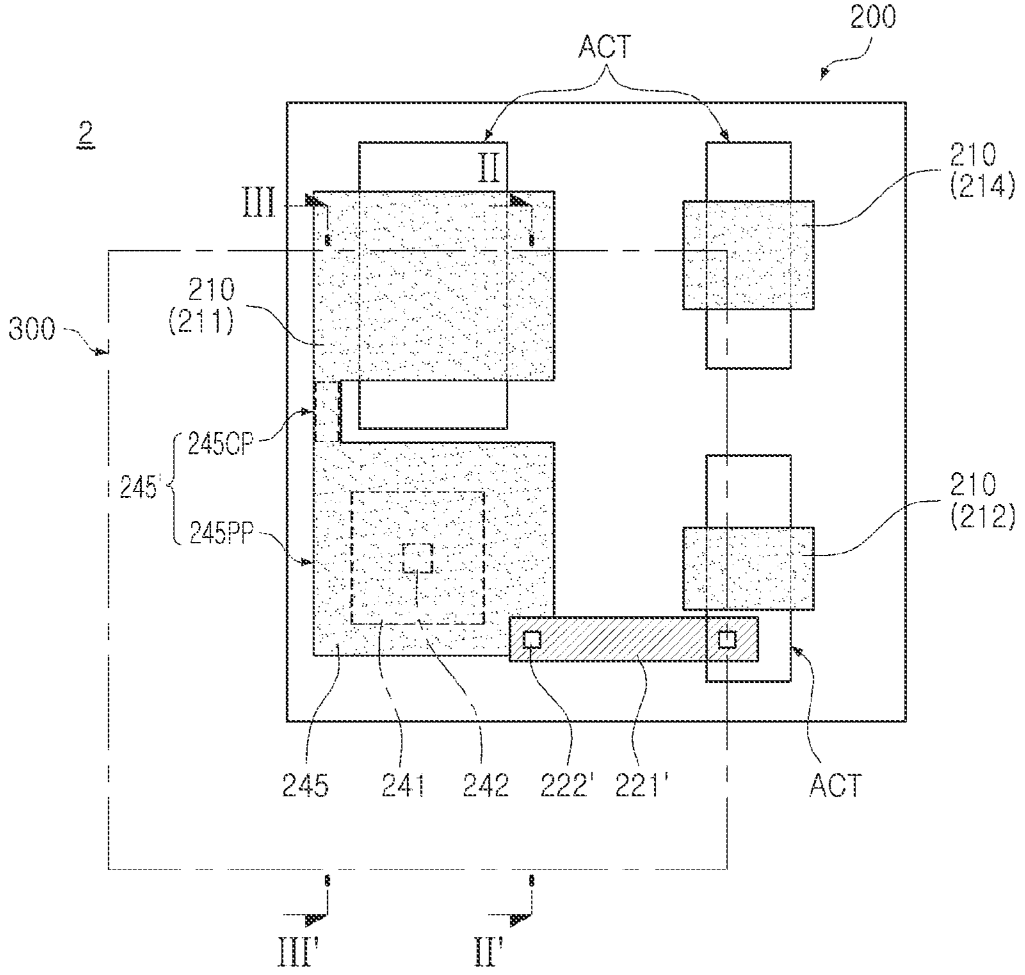
FIG. 8 illustrates a schematic plan view of an image sensor according to embodiments of the inventive concepts.

FIG. 8 illustrates a schematic plan view of an image sensor according to embodiments of the inventive concepts. FIG. 8 illustrates a plan view showing a region corresponding to FIG. 5.

Figure 9A:
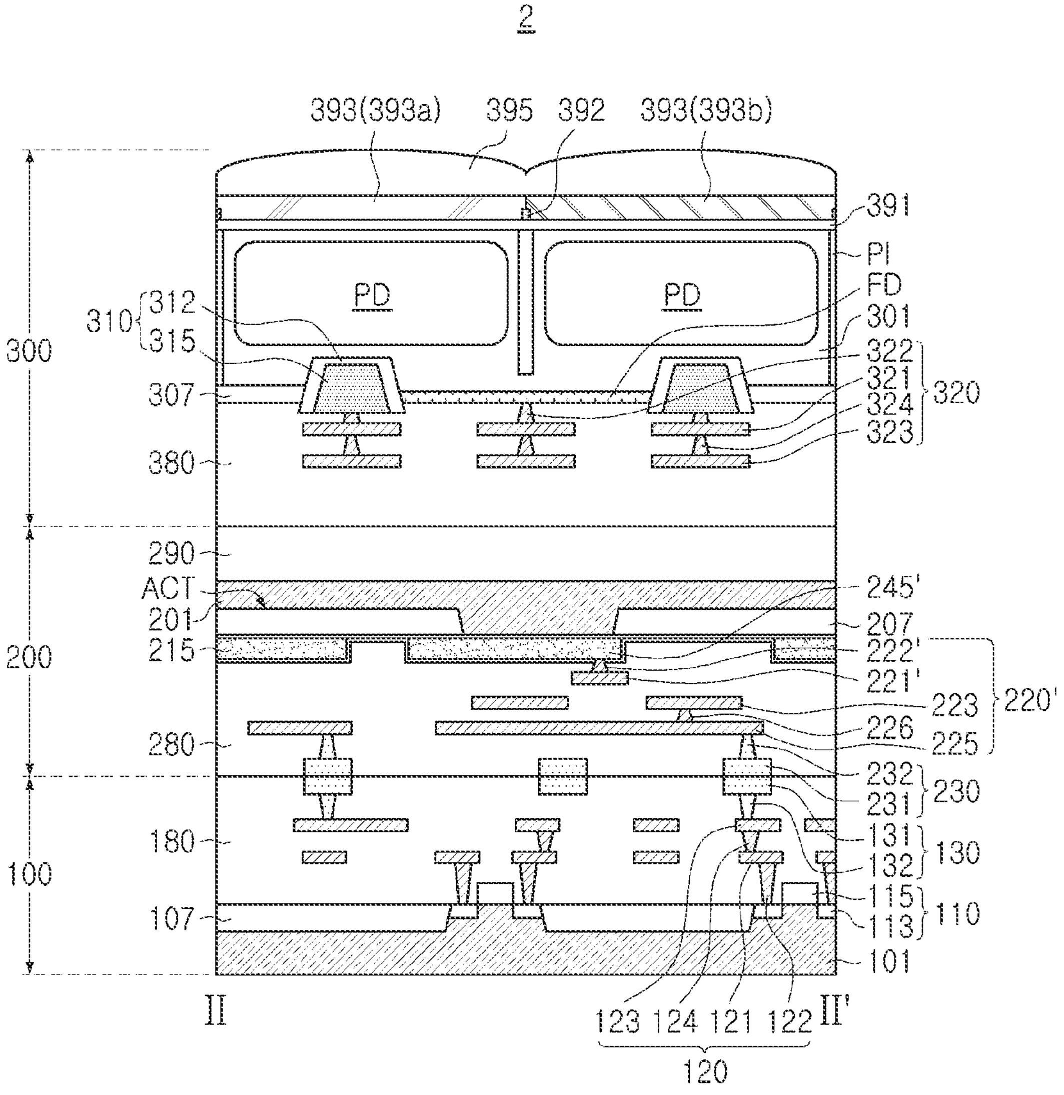
FIG. 9A illustrates a schematic cross-sectional view of an image sensor according to embodiments of the inventive concepts.
Figure 9B:
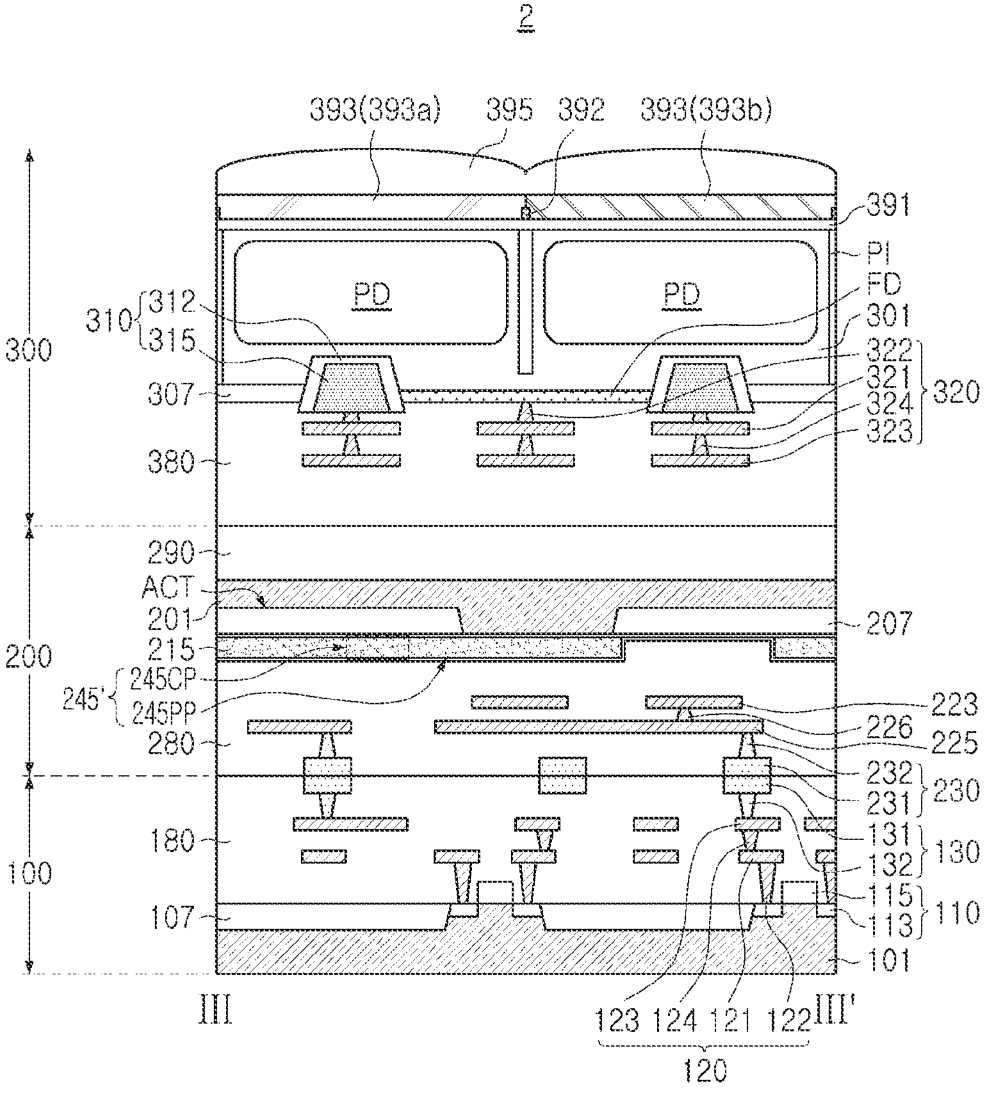
FIG. 9B illustrates another schematic cross-sectional view of the image sensor according to embodiments of the inventive concepts.

FIGS. 9A and 9B illustrate schematic cross-sectional views of an image sensor according to embodiments of the inventive concepts. FIG. 9A illustrates a cross-sectional view taken along line II-If of FIG. 8, and FIG. 9B illustrates a cross-sectional view taken along line of FIG. 8. In the following, description of structural features in FIGS. 8, 9A and 9B that are similar as shown in FIGS. 5, 6A and 6B may be omitted for the sake of brevity, and the description will focus on differences between the embodiment of FIGS. 8, 9A and 9B with respect to the embodiment shown in FIGS. 5, 6A and 6B.

Referring to FIGS. 8 to 9B, an image sensor 2 according to example embodiments may include a landing structure 245' and a second wiring structure 220' different from those of the image sensor 2 of FIGS. 4 to 7B.

The landing structure 245' may include a pad portion 245PP and a connection portion 245CP extending from the pad portion 245PP. The pad portion 245PP may have features the same as or similar as those of the landing structure described with reference to FIGS. 4 to 7B. The connection portion 245CP may connect the pad portion 245PP and at least a portion of second circuit devices 210, for example a first intermediate device 211. The connection portion 245CP may be integrally connected to the second gate electrode 215 of the first intermediate device 211. In an example embodiment, the pad portion 245PP, the connection portion 245CP, and the gate electrode 215 of the first intermediate device 211 may be disposed at substantially the same level and may have the same length (i.e., thickness) in a vertical direction. For example, the first intermediate device may be the driving transistor DX of FIG. 3B.

The second interconnection structure 220' may include a first intermediate interconnection line 221' and the first wiring via 222' having structures different from those of FIGS. 4 to 7B. In plan view, the first intermediate interconnection line 221' and the first intermediate via 222' do not overlap the first intermediate device 211. The first intermediate device 211 may be electrically connected to the third chip structure 300 through a connection portion 245CP, so that an additional wiring structure between the pad portion 245PP and the first intermediate element 211 may be omitted. Accordingly, as compared with the image sensor 1 of FIGS. 4 to 7B, an image sensor 2 may have an increased degree of integration and improved electrical characteristics, such as a relatively increased degree of freedom in wiring of the second wiring structure 220' or relatively reduced parasitic capacitance.

Figure 10:
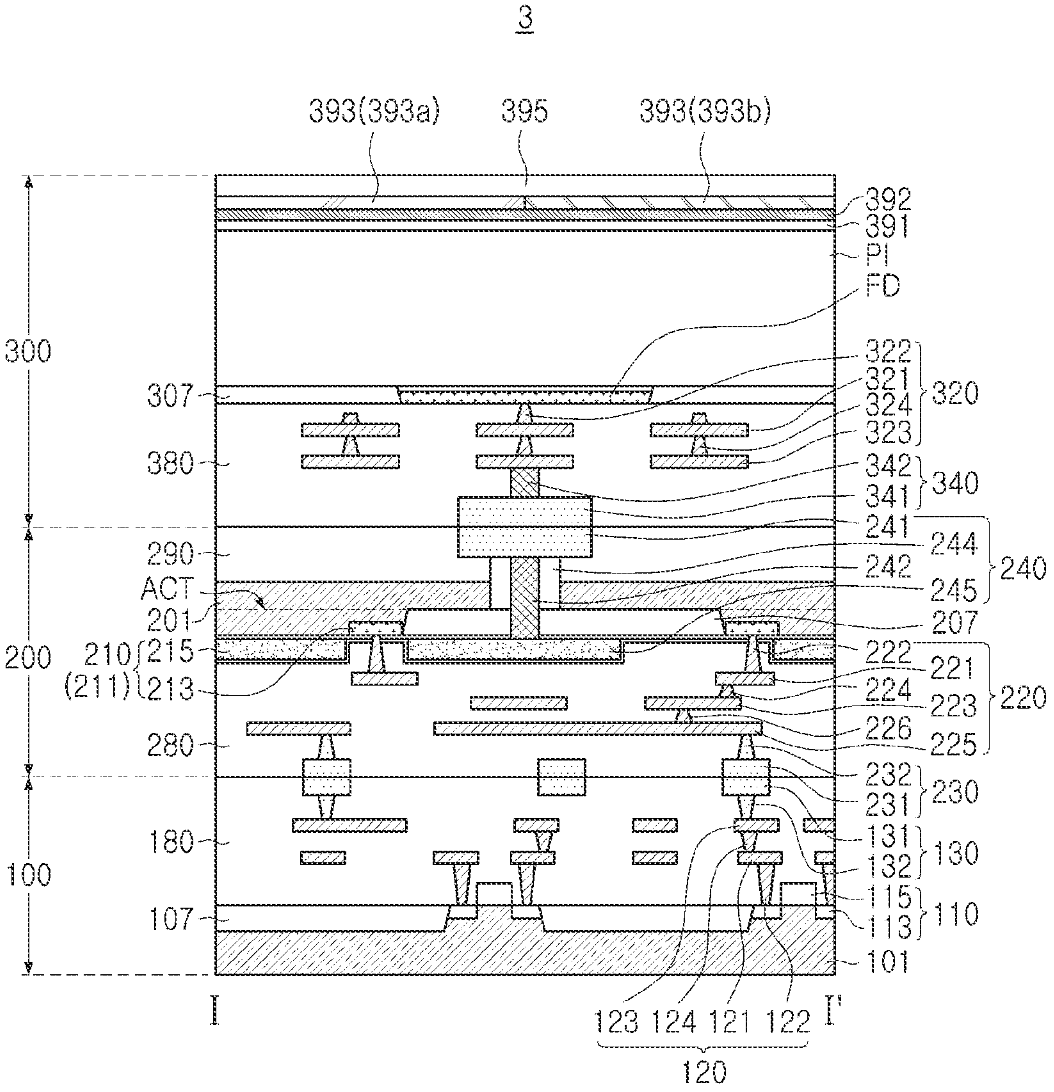
FIG. 10 illustrates a schematic cross-sectional view of an image sensor according to embodiments of the inventive concepts.

FIG. 10 illustrates a schematic cross-sectional view of an image sensor according to embodiments of the inventive concepts. FIG. 10 illustrates a cross-section corresponding to FIG. 6A. In the following, description of structural features in FIG. 10 that are similar as shown in FIG. 6A may be omitted for the sake of brevity, and the description will focus on differences between the embodiment of FIG. 10 with respect to the embodiment shown in FIG. 6A.

Referring to FIG. 10, in the image sensor 3 according to example embodiments, the third bonding via 242 may be in contact with the second isolation layer 207. As compared with FIG. 6A, a second isolation layer 207 may be disposed in the second substrate 201 in a region adjacent to the landing structure 245. In an example embodiment, the second isolation layer 207 may be formed to overlap the entire landing structure 245 in a plan view, but example embodiments are not limited thereto. The second isolation layer 207 may allow the third bonding via 242 and the second substrate 201 to be spaced apart from each other, together with the insulating spacer 244.

Figure 11:
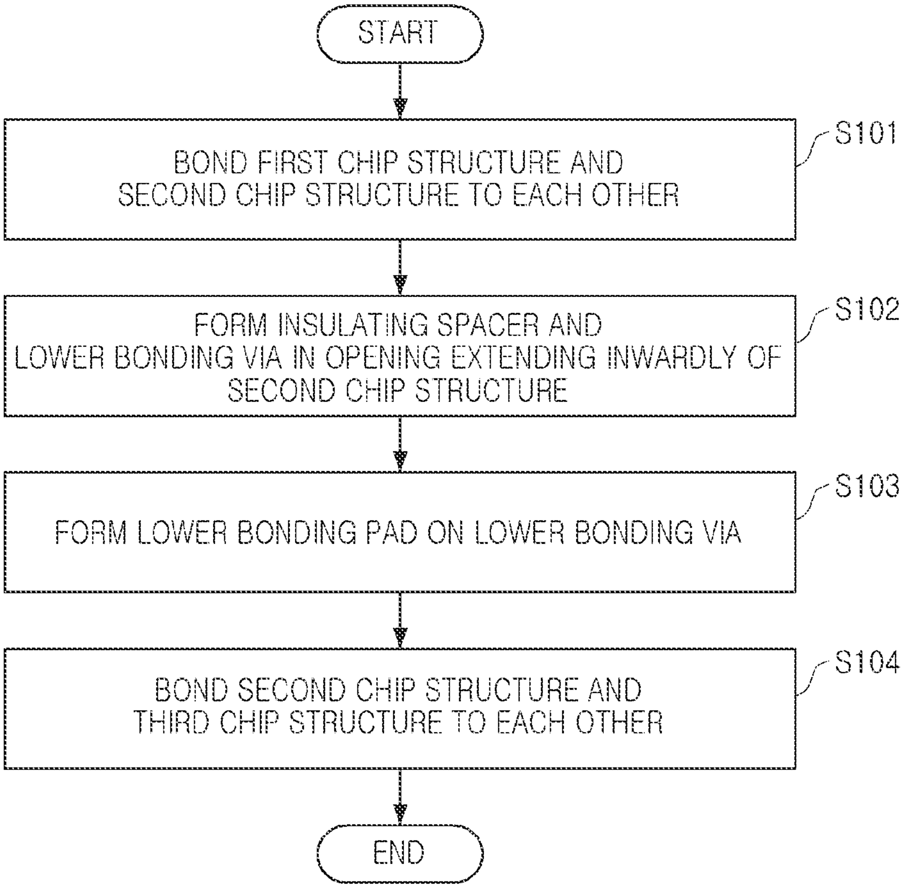
FIG. 11 illustrates a schematic flowchart of a method of manufacturing an image sensor according to embodiments of the inventive concepts.

FIG. 11 illustrates a schematic flowchart of a method of manufacturing an image sensor according to embodiments of the inventive concepts.

FIGS. 12A, 12B, 12C, 12D, 12E, 12F and 12G are cross-sectional views illustrating a method of manufacturing an image sensor according to example embodiments. FIGS. 12A to 12G illustrate a region corresponding to FIG. 6A.

Figure 12A:
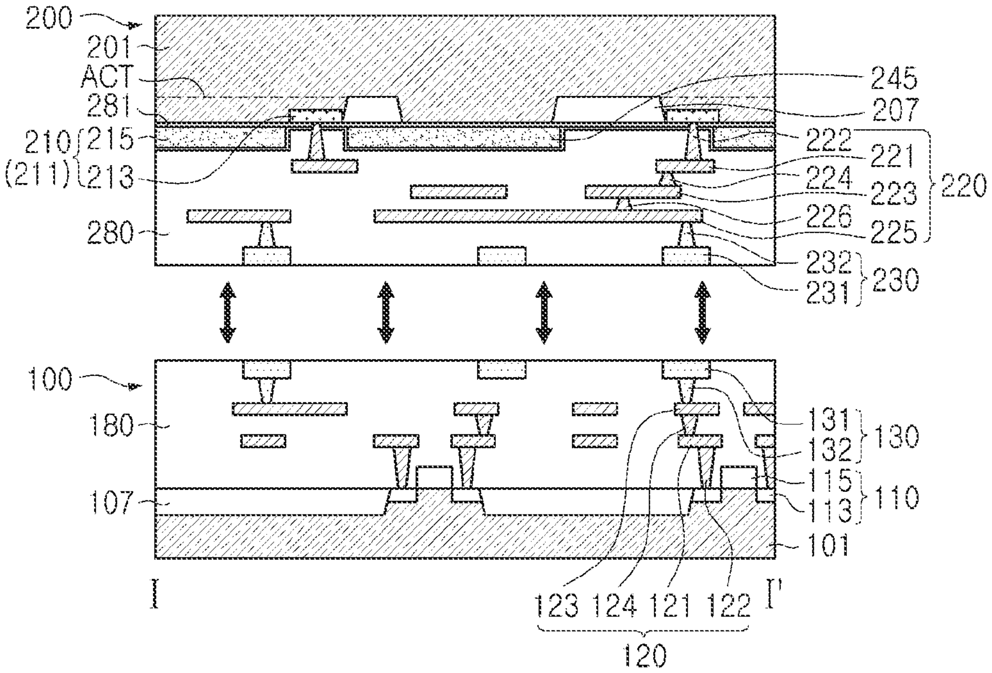
FIGS. 12A, 12B, 12C, 12D, 12E, 12F and 12G illustrate cross-sectional views illustrating a method of manufacturing an image sensor according to example embodiments.

Referring to FIGS. 11 and 12A, in operation S101, a first chip structure 100 and a second chip structure 200 are bonded to each other.

The first chip structure 100 is formed. The forming of the first chip structure 100 may include preparing a first substrate 101, forming a first device isolation layer 107 to define an active region on the first substrate 101, forming first circuit devices 110 on a first substrate 101, and forming a first wiring structure 120 electrically connected to the first circuit elements 110 on the first substrate 101, a first bonding structure 130 on the first wiring structure 120, and a first insulating layer 180 covering the first circuit devices 110 and the first wiring structure 120. A planarization process is performed such that an upper surface of the first insulating layer 180 and an upper surface of the first bonding pad 131 of the first bonding structure 130 are substantially coplanar with each other.

A second chip structure 200 is formed. The forming the second chip structure 200 may include preparing a second substrate 201, forming a second isolation layer 207 to define an active region ACT on the second substrate 201, forming second circuit devices 210 and a landing structure 245 on the second substrate 201, and forming second wiring structure 220 electrically connected to the second circuit elements 210 on the second substrate 201, a second lower bonding structure 230 on the second wiring structure 220, and a second lower insulating layer 280 covering the second circuit devices 210 and the second wiring structure 220.

The second circuit devices 210 and the landing structure 245 may be formed by forming the first insulating liner 281 on the second substrate 201, and then depositing a semiconductor material layer and performing a patterning process. Accordingly, the landing structure 245 includes the same material as the second gate electrode 215 of the second circuit devices 210 and may have substantially the same height (e.g., thickness) as the second circuit devices 210. In an example embodiment, the landing structure 245 is spaced apart from the second gate electrode 215, but may be formed to be integrally connected to the second gate electrode 215 by adjusting process conditions of the patterning process according to example embodiments.

A planarization process is performed such that an upper surface of the second lower insulating layer 280 and an upper surface of the second bonding pad 231 of the second lower bonding structure 230 are substantially coplanar with each other.

Then, the first chip structure 100 and the second chip structure 200 are bonded by turning over the second chip structure 200 and performing a bonding process on the first chip structure 100. The bonding process may include a Cu-to-Cu bonding process in which the first bonding pad 131 of the first chip structure 100 and the second bonding pad 231 of the second chip structure 200 are bonded to each other. Also, according to example embodiments, the bonding process may further include a dielectric-to-dielectric bonding process in which the first insulating layer 180 and the second lower insulating layer 280 are bonded to each other.

Figure 12B:
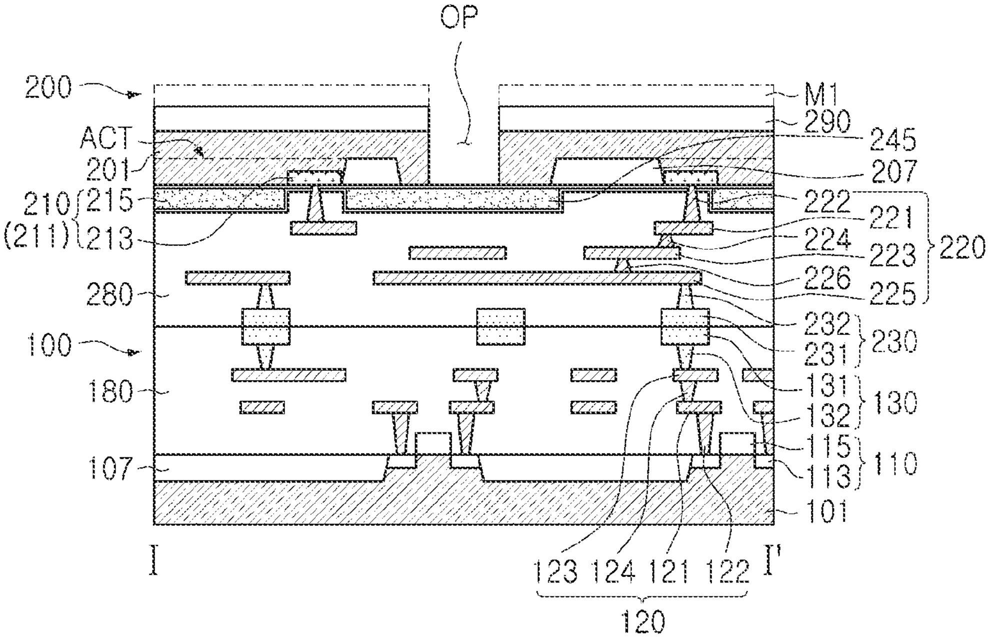

Referring to FIGS. 11 and 12B, in operation S102, an opening OP is formed to extend inwardly of the second chip structure 200.

A grinding process may be performed to remove a portion of the second substrate 201. Second upper insulating layer 290 and a first mask M1 are sequentially deposited on the second substrate 201. An etching process is performed using the first mask M1 to form an opening OP penetrating through the second upper insulating layer 290 and the second substrate 201. After forming the opening OP, the first mask M1 may be removed.

Figure 12C:
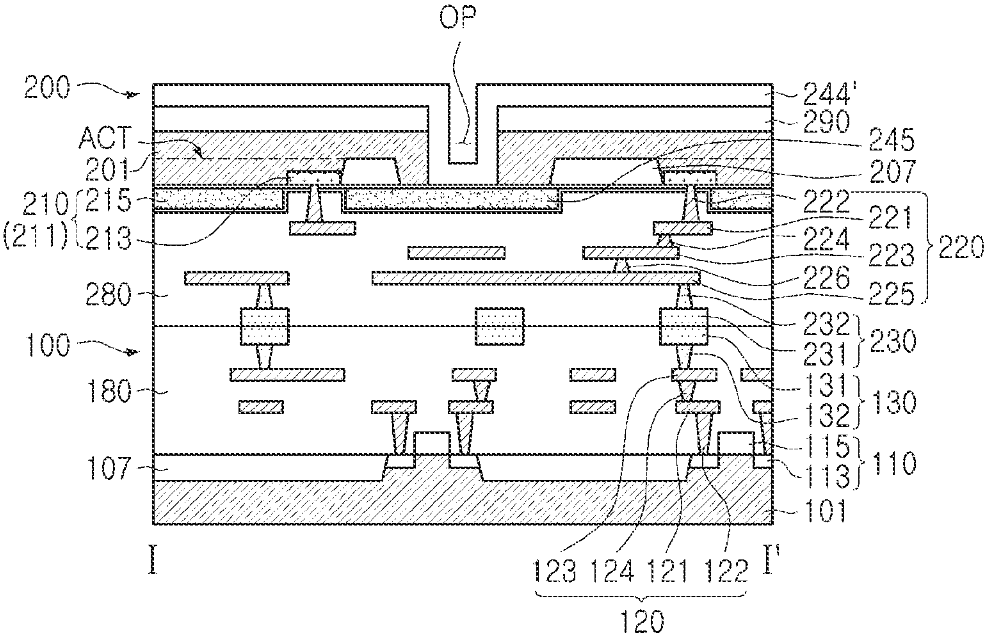

Referring to FIG. 12C, a preliminary insulation spacer 244' is formed on the second chip structure 200.

The preliminary insulating spacer 244' may be formed by depositing an insulating material layer to conformally cover the second upper insulating layer 290 and the opening OP. The insulating material layer may include, for example, a silicon oxide, but example embodiments are not limited thereto. The preliminary insulating spacer 244' covers a sidewall and a bottom surface of the opening OP.

Figure 12D:
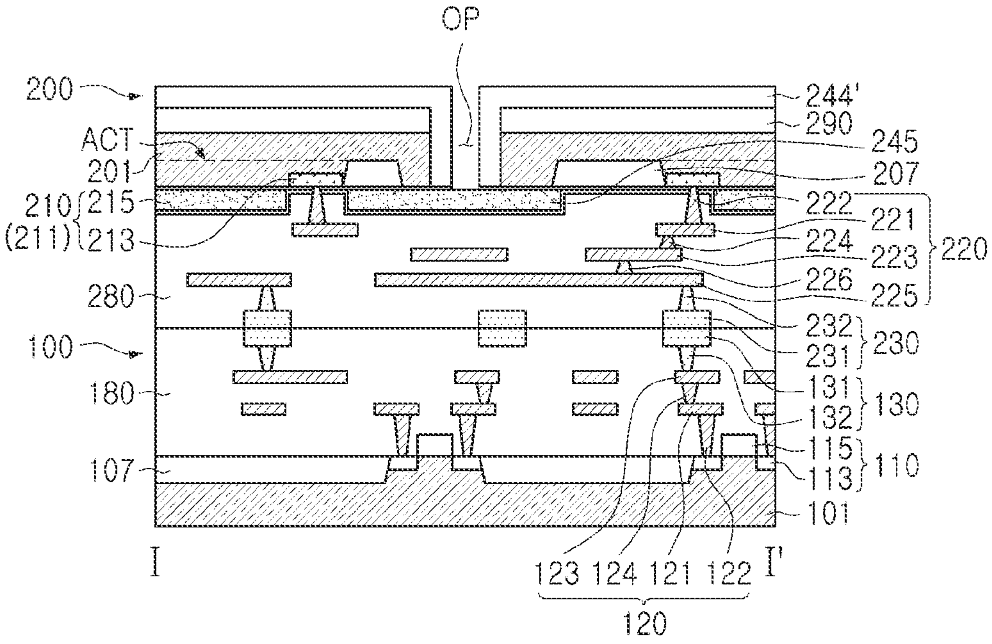

Referring to FIG. 12D, a portion of the preliminary insulation spacer 244' is removed.

An anisotropic etching process may be performed using an additional mask layer to remove a portion of the preliminary insulating spacer 244' disposed on the bottom surface of the opening OP. The first insulating liner 281 may be removed by the anisotropic etching process to expose the landing structure 245. According to example embodiments, a portion of the landing structure 245 may be removed together by the anisotropic etching process.

Figure 12E:
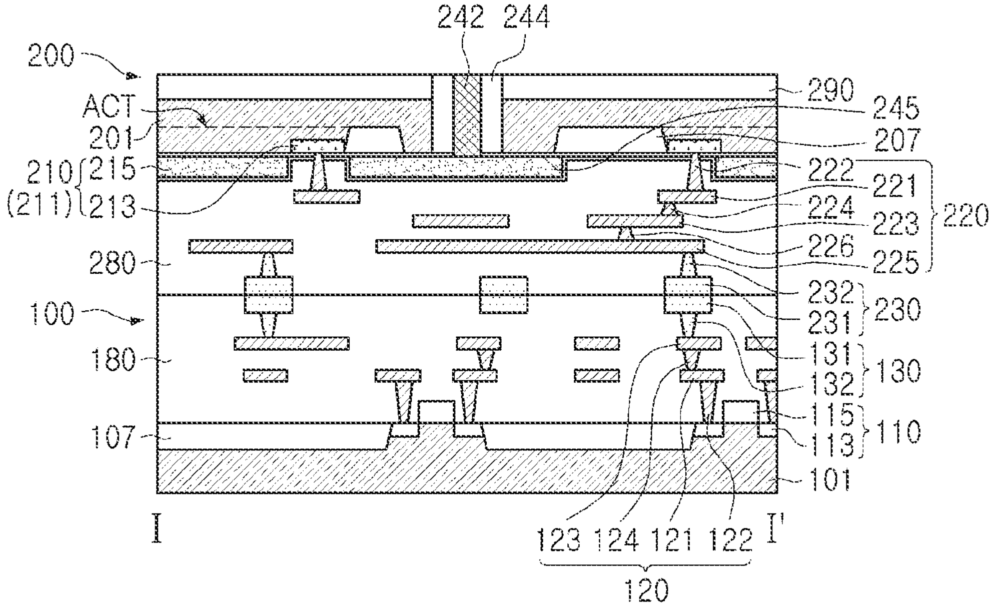

Referring to FIGS. 11 and 12E, in operation S102, an insulating spacer 244 and a lower bonding via 242 are formed in the opening OP.

A metal material layer may be deposited inside the opening OP and on the preliminary insulating spacer 244' and a planarization process may be performed, so that an insulating spacer 244 and a lower bonding via 242 are formed. In an example embodiment, the insulating spacer 244 is a portion of the preliminary insulating spacer 244' remaining after a portion disposed on the second upper insulating layer 290 is removed through the planarization process, and may refer to a portion of the preliminary insulation spacer 244' surrounding the sidewall of the opening OP. According to some embodiments, a portion of the preliminary insulation spacer 244' on the second upper insulating layer 290 may not be completely removed through the planarization process and may remain. The lower bonding via 242 may refer to a portion of the metal material layer remaining in the opening OP after the portion of the metal material layer disposed on the top surface of the second preliminary insulating spacer 244' is removed through the planarization process. The metal material layer may include, for example, copper (Cu) or tungsten (W). According to example embodiments, when a portion of the landing structure 245 is removed when the opening OP is formed, a lower end of the lower bonding via 242 may extend inwardly of the landing structure 245 by a predetermined depth.

Figure 12F:
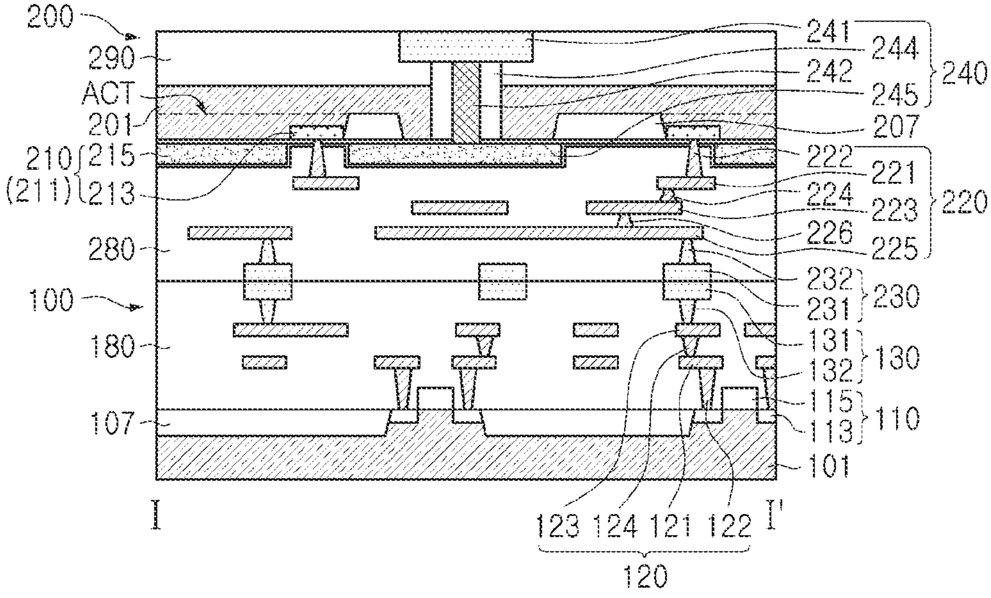

Referring to FIGS. 11 and 12F, in operation S103, a lower bonding pad 241 is formed on the lower bonding via 242.

A second upper insulating layer 290 is further formed to cover the lower bonding via 242 and the insulating spacer 244. An etching process is performed to form an opening in the second upper insulating layer 290 that exposes the lower bonding via 242. A metal material is deposited in the opening to thus form a lower bonding pad 241. The metal material may include, for example, copper (Cu).

In some embodiments, unlike the description as provided with respect to FIGS. 12E and 12F, the lower bonding via 242 and the lower bonding pad 241 may be formed by a single deposition process.

Figure 12G:
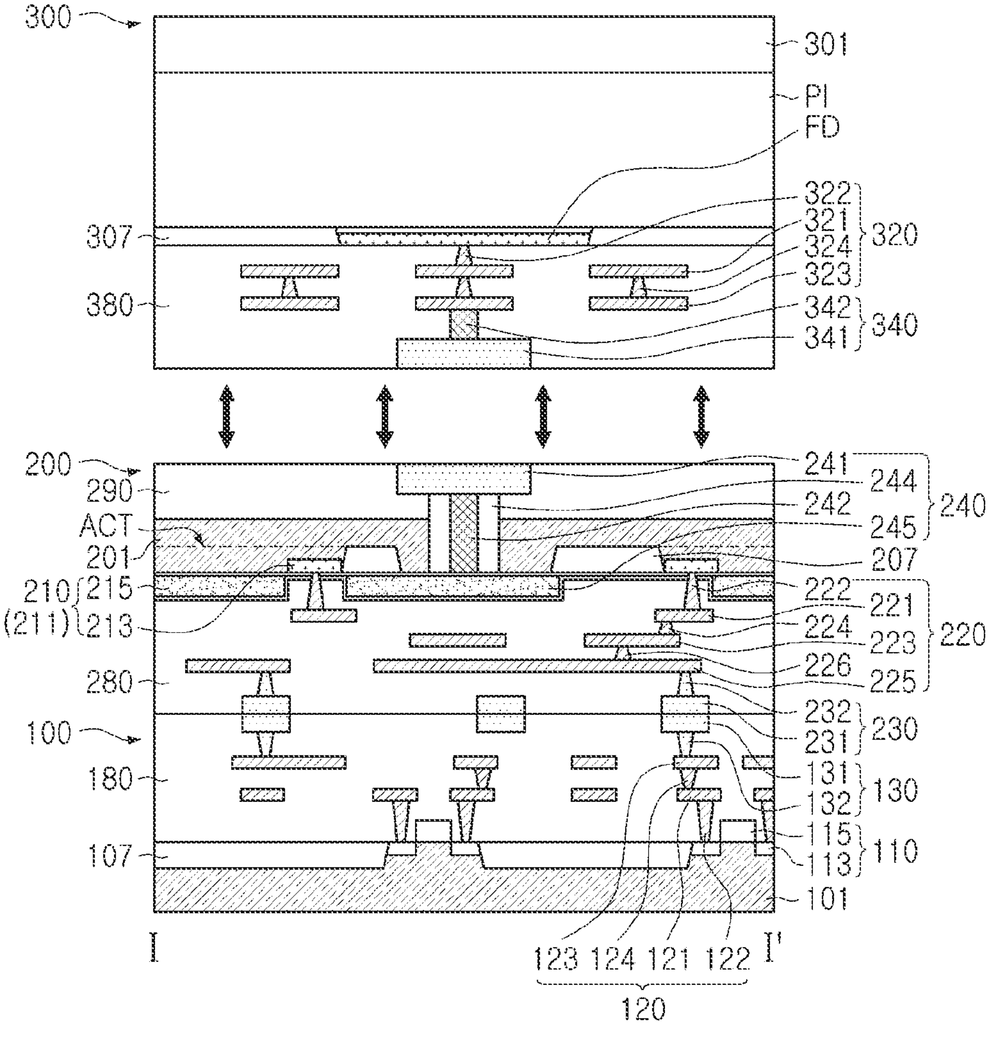

Referring to FIGS. 11 and 12G, in operation S104, the second chip structure 200 and the third chip structure 300 are bonded.

A third chip structure 300 is formed. The forming of the third chip structure 300 may include preparing a third substrate 301, forming a separation structure PI and photoelectric conversion devices PD (e.g., see FIG. 6B) in the third substrate 301, forming a third isolation layer 307 to define an active region of the second substrate 301, and forming third circuit devices 310 (e.g., see FIG. 6B), a third wiring structure 320 electrically connected to the third circuit devices 310, and a third insulating layer 380 covering the third wiring structure 320 on the third substrate 301, and forming a third bonding structure 340. The order of forming the separation structure PI, the photoelectric conversion devices PD, and the third isolation layer 307 may be variously modified.

Then, a bonding process is performed using the third bonding structure 340 of the third chip structure 300 and the second upper bonding structure 240 of the second chip structure 200 to bond the second chip structure 200 and the third chip structure 300 to each other.

Referring to FIGS. 6A and 6B, a grinding process may be performed to remove a portion of the third substrate 301, and a horizontal insulating layer 391, a grid pattern 392, color filters 393, and microlenses 395 are formed, and thus an image sensor 1 may be manufactured.

FIGS. 13A, 13B, 13C and 13D illustrate cross-sectional views of a method of manufacturing an image sensor according to embodiments of the inventive concepts. FIGS. 13A to 13D illustrate regions corresponding to those of FIG. 6A. FIGS. 13A to 13D illustrate diagrams of modified examples of an operation corresponding to the operation S102 of FIG. 11 or operations corresponding to the operations of FIGS. 12B to 12E.

Figure 13A:
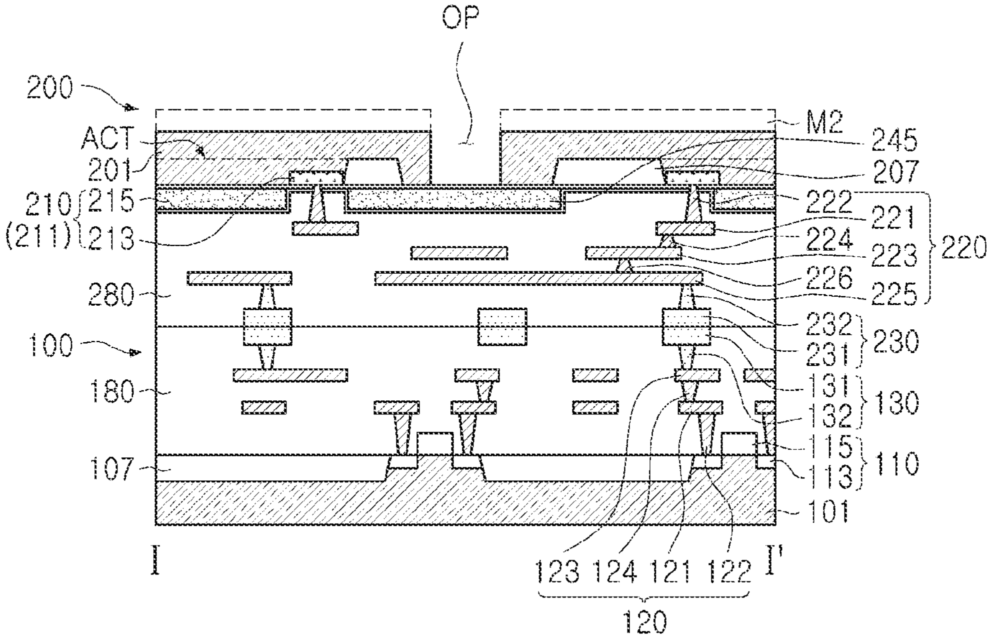
FIGS. 13A, 13B, 13C and 13D illustrate cross-sectional views illustrating a method of manufacturing an image sensor according to example embodiments.

Referring to FIG. 13A, an opening OP is formed to penetrate through the second substrate 201.

A first chip structure 100 and a second chip structure 200 may be bonded to each other in a manner which is identical or similar to that described in FIG. 12A, and second mask layer M2 may then be formed on the second substrate 201. By performing an etching process using the second mask layer M2, a portion of the second substrate 201 is removed to form an opening OP. Then, the second mask layer M2 may be removed.

Figure 13B:
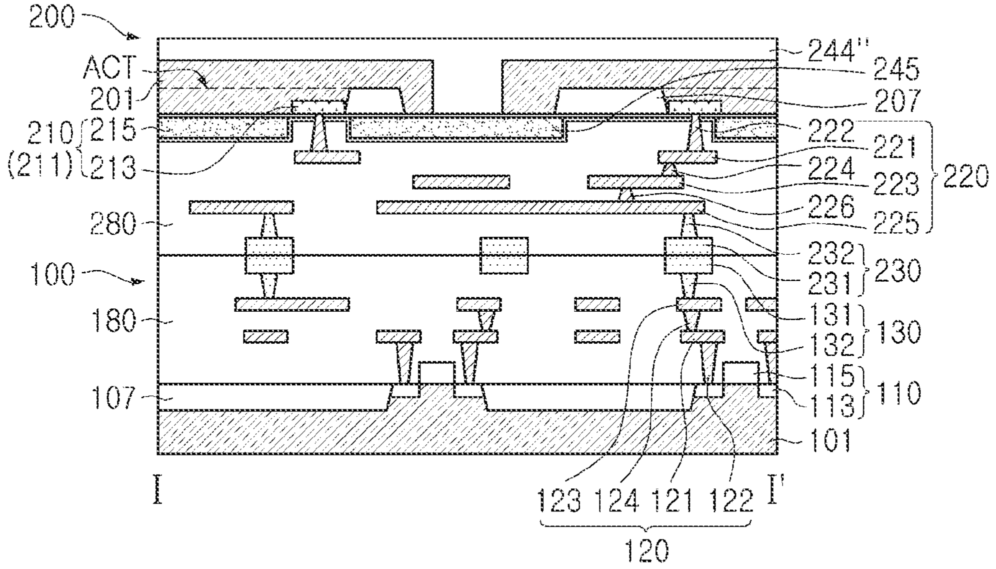

Referring to FIG. 13B, a preliminary insulation spacer 244" is formed.

The preliminary insulating spacer 244" may be formed by depositing an insulating material to cover the second substrate 201 and to fill the opening OP. The preliminary insulating spacer 244" may be formed to completely fill the opening OP. The preliminary insulating spacer 244" may include, for example, a silicon oxide.

Figure 13C:
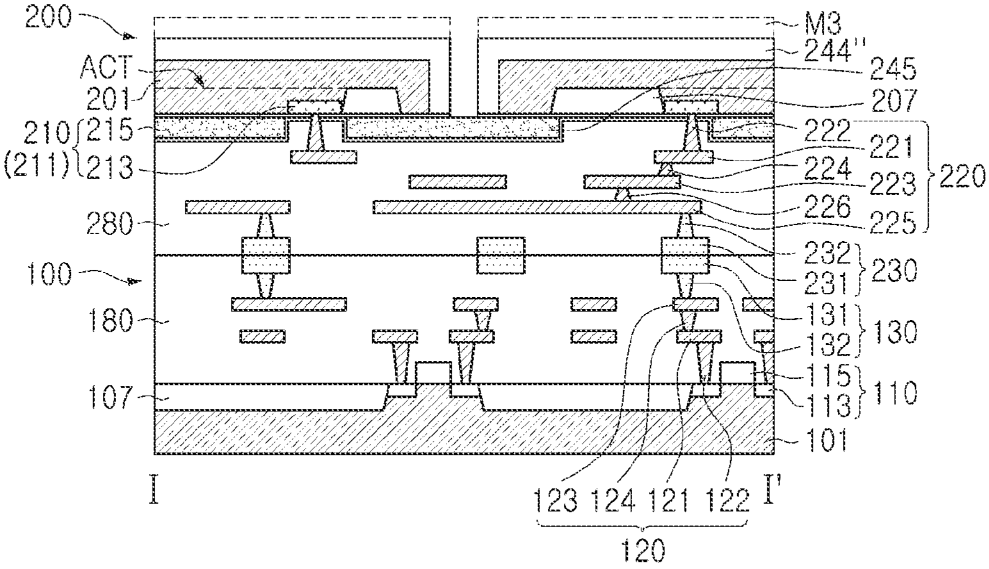

Referring to FIG. 13C, the landing structure 245 is exposed using the third mask layer M3.

A photoresist material may be deposited on the preliminary insulation spacer 244", and an exposure process may be performed to form a third mask layer M3. By performing an etching process using the third mask layer M3, a portion of the preliminary insulation spacer 244" may be removed and the landing structure 245 may be exposed. By performing the etching process, a portion of a region corresponding to the opening OP of the preliminary insulating spacer 244" may be removed and the first insulating liner 281 (e.g., see FIG. 12A) may be removed together to expose the landing structure 245.

Figure 13D:
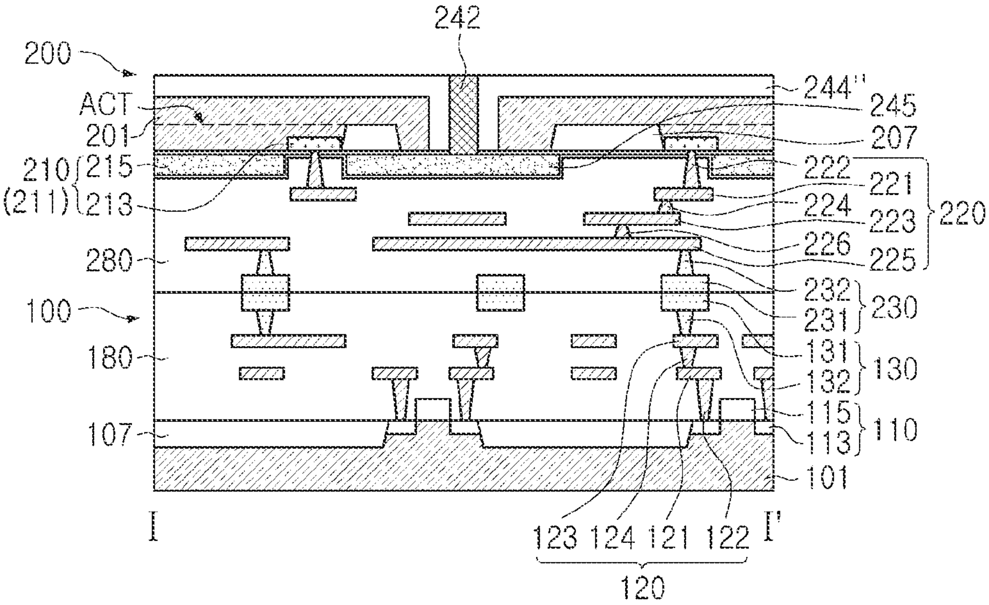

Referring to FIG. 13D, a lower bonding via 242 is formed.

A metal material may be deposited in a region corresponding to the opening OP, to be connected to the exposed landing structure 245, and a planarization process may be performed to form a lower bonding via 242.

Then, subsequent processes which are identical or similar to those described in FIGS. 12F and 12G may be performed to manufacture an image sensor 1.

As described above, a landing structure may be formed together with a gate electrode thorough a patterning process. Accordingly, an image sensor having increased integration density and improved electrical characteristics may be provided.

While example embodiments have been shown and described, it should be apparent to those skilled in the art that modifications and variations could be made without departing from the scope of the inventive concepts as defined by the appended claims.

What is claimed is:

1. An image sensor comprising:
- a first chip structure including a first substrate, first circuit devices on the first substrate, and a first wiring structure electrically connected to the first circuit devices;
- a second chip structure including
  - a second substrate disposed on the first chip structure and having a first surface facing the first chip structure and a second surface opposing the first surface,
  - second circuit devices between the first surface and the first chip structure, the second circuit devices including gate electrodes,
  - a second wiring structure electrically connected to the second circuit devices between the second circuit devices and the first chip structure,
  - a lower bonding via penetrating through the second substrate, and
  - a lower bonding pad on the lower bonding via; and
- a third chip structure including
  - a third substrate disposed on the second surface of the second substrate and including photoelectric conversion devices,
  - third circuit devices disposed between the second surface and the third substrate,
  - a third wiring structure electrically connected to the third circuit devices between the third circuit devices and the second chip structure,
  - an upper bonding via electrically connected to the third wiring structure, and
  - an upper bonding pad bonded to the lower bonding pad below the upper bonding via,
- wherein the second chip structure further includes a landing structure contacting a lower end of the lower bonding via, and
- wherein the landing structure includes a same material as the gate electrodes of the second circuit devices.

2. The image sensor of claim 1, wherein the landing structure includes polycrystalline silicon.

3. The image sensor of claim 1, wherein the second wiring structure includes intermediate interconnection lines and intermediate vias disposed on a plurality of levels,
- the intermediate interconnection lines include a first intermediate interconnection line disposed at a level closest to the second circuit devices, and the landing structure is at a higher level than the first intermediate interconnection line.

4. The image sensor of claim 3, wherein the intermediate vias include a first intermediate via connecting the first intermediate interconnection line and a second circuit device from among the second circuit devices to each other, and a lower surface of the landing structure is at a higher level than a lower end of the first intermediate via.

5. The image sensor of claim 4, wherein the lower end of the lower bonding via is at a higher level than the lower end of the first intermediate via.

6. The image sensor of claim 1, wherein an upper end of the lower bonding via is at a higher level than the second surface of the second substrate.

7. The image sensor of claim 1, wherein the landing structure includes a portion horizontally overlapping at least a portion of the second circuit devices.

8. The image sensor of claim 1, wherein the landing structure has substantially a same thickness as the gate electrodes of the second circuit devices.

9. The image sensor of claim 1, wherein the landing structure is spaced apart from the second circuit devices.

10. The image sensor of claim 1, wherein the second circuit devices include a first intermediate device, a second intermediate device, and a third intermediate device, the landing structure further includes a connection portion extending to the first intermediate device, and the connection portion of the landing structure is integrally connected to a gate electrode of the first intermediate device.

11. The image sensor of claim 10, wherein the first intermediate device is a driving transistor, the second intermediate device is a reset transistor, and the third intermediate device is a select transistor.

12. The image sensor of claim 10, wherein the second wiring structure includes intermediate interconnection lines and intermediate vias disposed on a plurality of levels, the intermediate interconnection lines include a first intermediate interconnection line disposed at a level closest to the second circuit devices, the intermediate vias include a first intermediate via connecting the first intermediate interconnection line and one of the second and third intermediate devices to each other, and the first intermediate interconnection line and the first intermediate via do not vertically overlap the first intermediate device.

13. The image sensor of claim 1, wherein the second chip structure further includes an insulating spacer between the lower bonding via and the second substrate, an external side surface of the insulating spacer is surrounded by the second substrate, and a lower surface of the insulating spacer is covered with the landing structure.

14. The image sensor of claim 13, wherein the lower surface of the insulating spacer is coplanar with the first surface of the second substrate.

15. The image sensor of claim 1, wherein the first chip structure further includes a first bonding structure on the first wiring structure, the second chip structure further includes a second lower bonding structure below the second wiring structure, each of the first bonding structure and the second lower bonding structure includes copper (Cu), and the first chip structure and the second chip structure are bonded to each other by the first bonding structure and the second lower bonding structure.

16. An image sensor comprising:

a lower substrate having a first surface and a second surface opposing the first surface;

lower circuit devices disposed on the first surface;

a lower wiring structure electrically connected to the lower circuit devices on the first surface;

a lower bonding pad on the second surface;

a lower bonding via penetrating through the lower substrate between the lower bonding pad and the lower wiring structure;

a landing structure disposed on the first surface and contacting the lower bonding via;

an upper bonding pad bonded to the lower bonding pad on the lower bonding pad; and an upper substrate disposed on the upper bonding pad and including photoelectric conversion devices, wherein at least a portion of the landing structure horizontally overlaps the lower circuit devices.

17. The image sensor of claim 16, wherein a height of the landing structure in a vertical direction is substantially the same as a height of the lower circuit devices in the vertical direction.

18. The image sensor of claim 16, further comprising upper circuit devices and an upper wiring structure between the upper bonding pad and the upper substrate.

19. An image sensor comprising:

a first chip structure including a first substrate, first circuit devices on the first substrate, and a first wiring structure electrically connected to the first circuit devices;

a second chip structure including a second substrate disposed on the first chip structure and having a first surface facing the first chip structure and a second surface opposing the first surface, second circuit devices between the first surface and the first chip structure, the second circuit devices including gate electrodes, a second wiring structure electrically connected to the second circuit devices between the second circuit devices and the first chip structure, a lower bonding via penetrating through the second substrate, and a lower bonding pad on the lower bonding via; and a third chip structure including a third substrate disposed on the second surface of the second substrate and including photoelectric conversion devices, third circuit devices disposed between the second surface and the third substrate, a third wiring structure electrically connected to the third circuit devices between the third circuit devices and the second chip structure, an upper bonding via electrically connected to the third wiring structure, and an upper bonding pad bonded to the lower bonding pad below the upper bonding via, wherein a lower end of the lower bonding via is at a higher level than a lower surface of the gate electrodes of the second circuit devices.

20. The image sensor of claim 19, wherein the upper bonding pad and the lower bonding pad include copper (Cu).

* * * * *